United States Patent [19]
Klaassen et al.

[11] Patent Number: 5,986,839
[45] Date of Patent: *Nov. 16, 1999

[54] ELECTRONIC MAGNETORESISTIVE SENSOR BIASING USING A TRANSDUCER EQUIVALENT CIRCUIT AND CURRENT SOURCES

[75] Inventors: Klaas Berend Klaassen; Jacobus van Peppen, both of San Jose, Calif.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/718,072

[22] Filed: Sep. 17, 1996

[51] Int. Cl.$^6$ .................................................. G11B 5/03
[52] U.S. Cl. ............................................................ 360/66
[58] Field of Search ........................ 324/207.12, 174; 360/66, 67, 113, 46; 327/540, 538, 72; 323/316; 330/257

[56] References Cited

U.S. PATENT DOCUMENTS

| | | | |
|---|---|---|---|
| 3,979,775 | 9/1976 | Schwaratz | 360/113 |
| 4,050,086 | 9/1977 | Harr | 360/66 |
| 4,660,113 | 4/1987 | Nomura et al. | 360/113 |
| 4,712,144 | 12/1987 | Klaassen | 360/67 |
| 4,786,993 | 11/1988 | Jove et al. | 360/67 |
| 4,833,559 | 5/1989 | Belk | 360/113 |
| 5,068,606 | 11/1991 | Kawate et al. | 324/174 |
| 5,122,915 | 6/1992 | Klein et al. | 360/113 |
| 5,168,244 | 12/1992 | Muranaka | 330/257 |
| 5,309,294 | 5/1994 | Cahalan | 360/66 |
| 5,309,295 | 5/1994 | Bailey et al. | 360/66 |
| 5,327,303 | 7/1994 | Smith | 360/67 |
| 5,351,003 | 9/1994 | Bauer et al. | 324/207.12 |
| 5,357,150 | 10/1994 | Jaquette | 327/72 |
| 5,367,411 | 11/1994 | Nishiyama et al. | 360/66 |
| 5,751,510 | 5/1998 | Smith et al. | 360/67 |

FOREIGN PATENT DOCUMENTS 62-078754  4/1987  Japan .

OTHER PUBLICATIONS

IBM Technical Disclosure Bulletin vol. 27, No. 1A, Jun. 1984, pp. 166–167, entitled "Adaptive Compensator" by J. M. Karp & G. H. Sonu.

*Primary Examiner*—W. Chris Kim
*Attorney, Agent, or Firm*—Khanh Q. Tran; Banner & Witcoff, Ltd.

[57] ABSTRACT

A magnetoresistive transducer biasing technique that provides a uniform transducer biasing in a product. The technique provides biasing for transducer constant power dissipation, constant sensor current density biasing, constant sensor bias voltage, constant sensor temperature rise biasing, and constant effective magnetic biasing of a transducer.

32 Claims, 18 Drawing Sheets

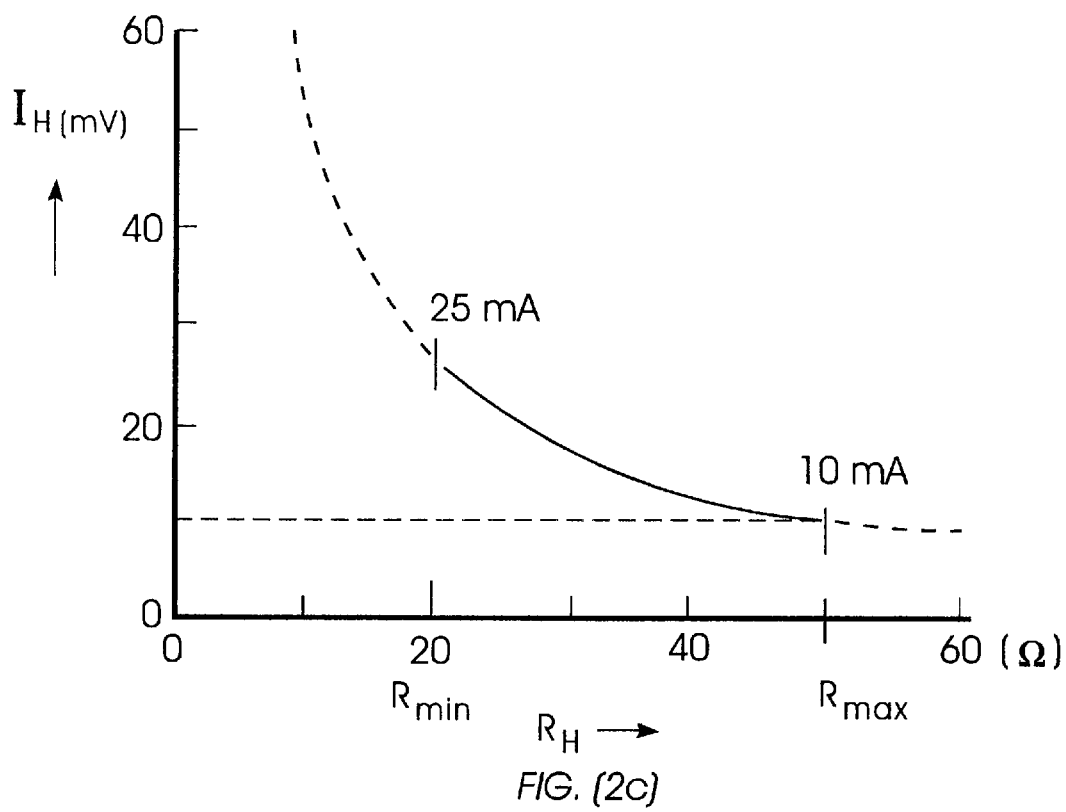
FIG. (2c)
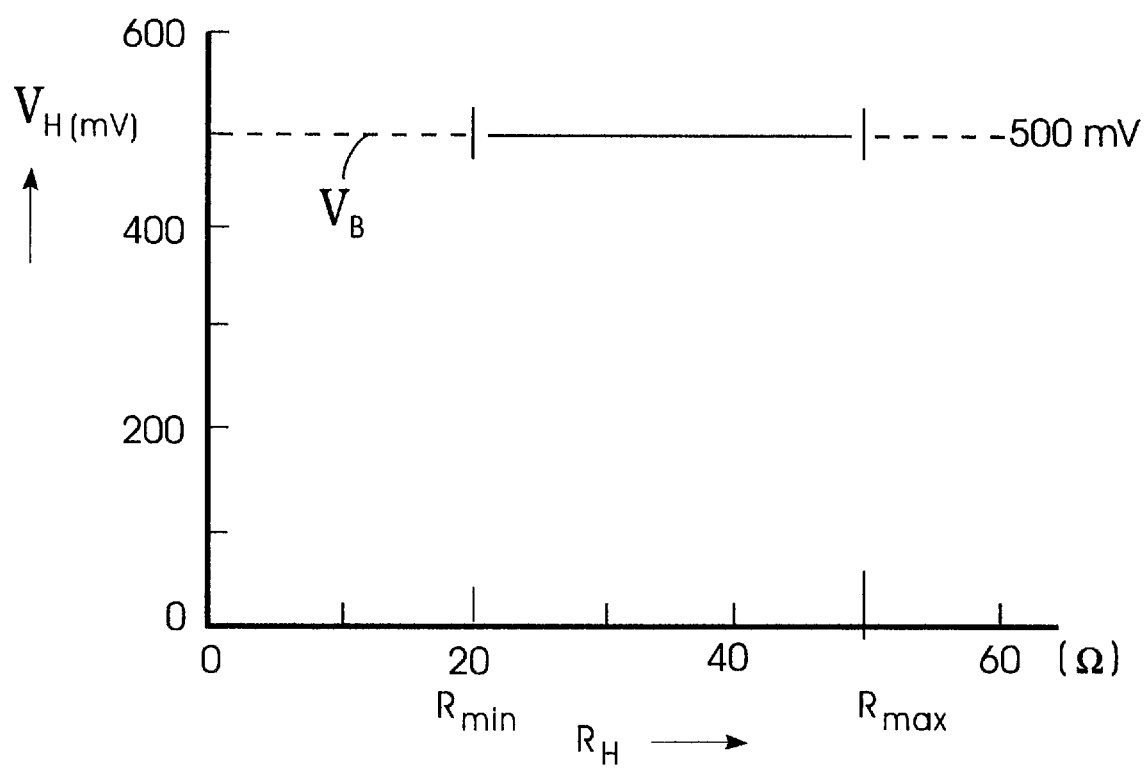
FIG. (2d)

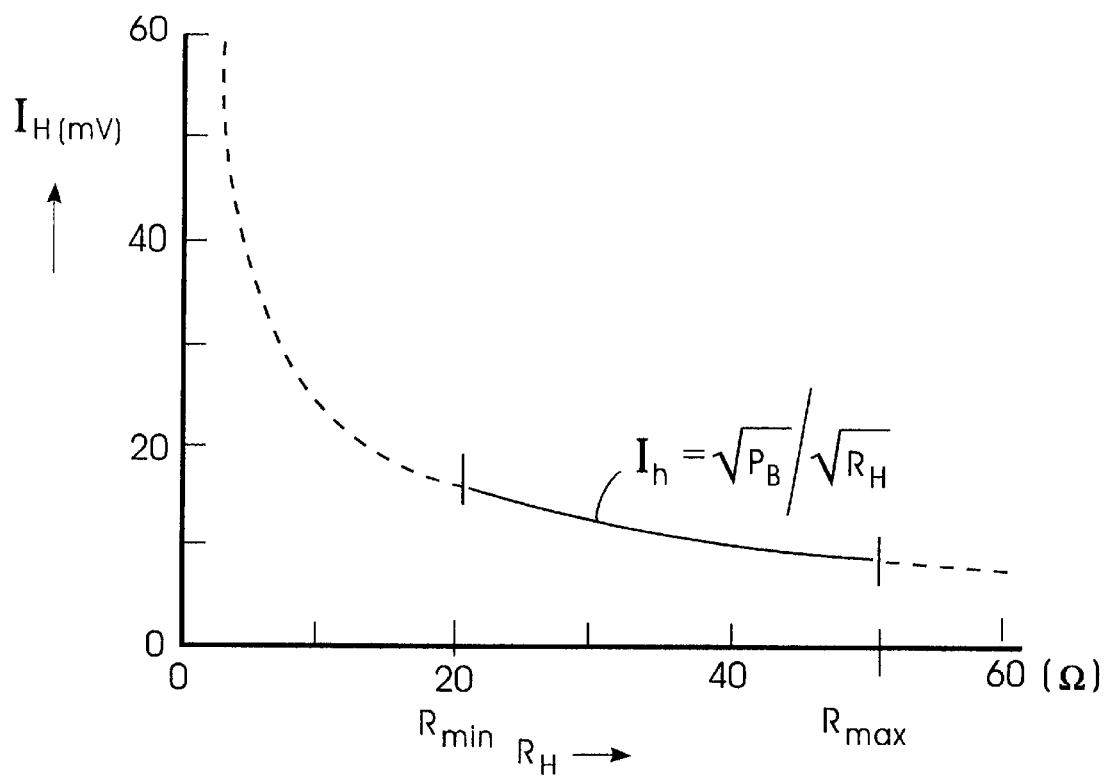
FIG. (3a)
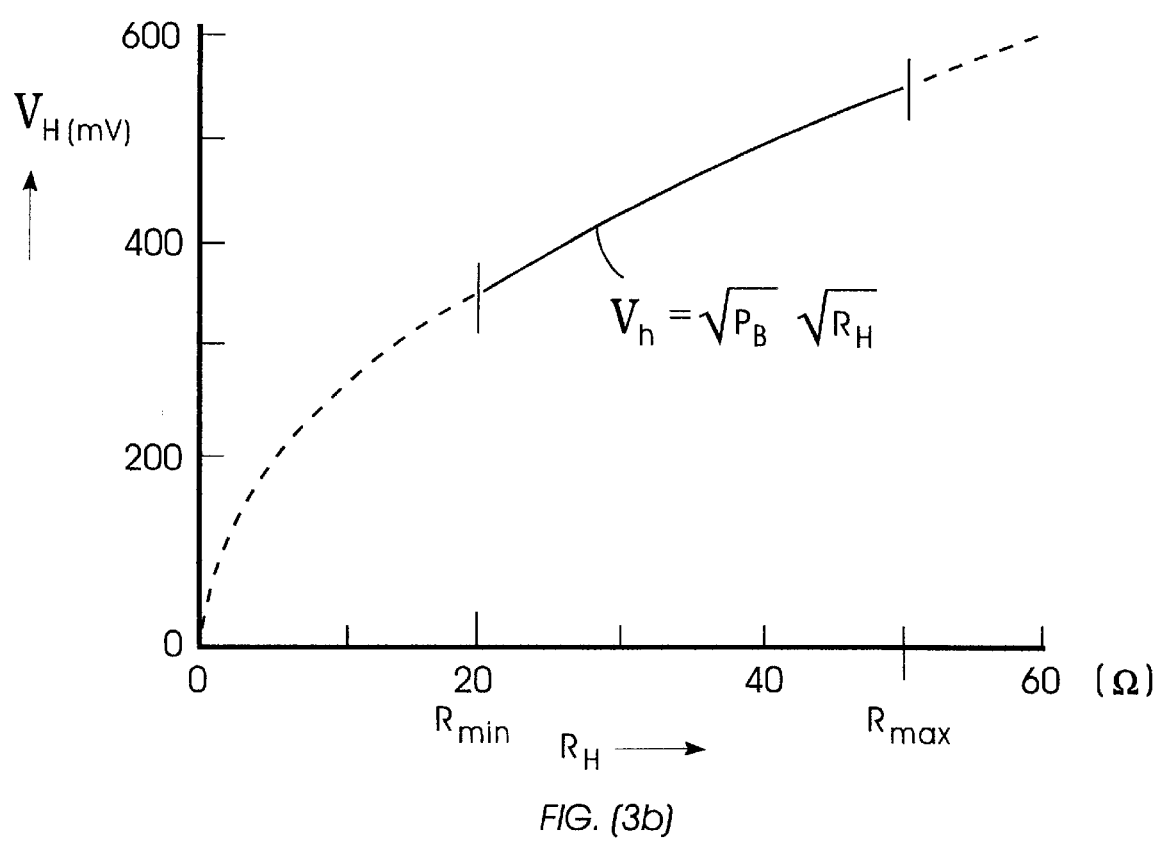
FIG. (3b)

$IR_L = V_B$

ELECTRONIC MAGNETORESISTIVE SENSOR BIASING USING A TRANSDUCER EQUIVALENT CIRCUIT AND CURRENT SOURCES

BACKGROUND OF THE INVENTION

1. Field of the Invention

The present invention relates to magnetoresistive (MR) sensor biasing. More particularly, the present invention relates to magnetoresistive sensor biasing methods and circuits.

2. Description of the Related Art

For the purpose of this disclosure, the terms "magnetoresistive (MR) sensor" and "MR head" both encompass any magnetoresistive element used for detecting a varying magnetic field by detecting a change in resistance $\Delta R_S$ of the element resistance $R_S$ caused by variations in the magnetic field. Also for purposes of this disclosure, the terms MR sensor and MR head are both not limited to magnetic recording elements only. Examples of embodiments of MR sensors that are contemplated to be within the scope of these two terms include, but are not limited to, barber pole MRs, dual MRs, soft adjacent layer MRs, differential MRs, spin valve MRs, tunnel junction MRs and giant MRs.

An MR sensor is an energetically passive sensor that uses a sense current (or voltage) for detecting a change in sensor resistance in the form of a signal voltage or signal current. The sense current may also be used for providing all or part of a magnetic bias for the sensor that is needed for proper MR sensor operation. This disclosure does not distinguish between sense and bias current (or voltage). The terms (MR sensor) bias current and voltage are used interchangeably throughout this disclosure. The biasing and readout electronics associated with an MR sensor are generally referred to as an arm electronic (AE) module.

The physical characteristics of an MR sensor are determined by the properties of the materials used, the MR sensor sandwich configuration, and the sensor dimensions, that is, the thickness, height and length of the sensor. The dimension having the greatest tolerance in externally exposed MR sensors used for magnetic recording is the sensor height h. The tolerance on this dimension is for compensating for head wear and lapping for tape heads, and for ABS lapping for disk drive heads.

FIG. 1(a) shows the physical relationships between the different resistances forming the total MR head resistance $R_H$. FIG. 1(b) shows a schematic diagram for an electrical model of resistance $R_H$. The total MR head resistance $R_H$ is measured at terminals 10 and 11 of the AE module. The MR head and the AE module are shown as part of a disk drive 12 in FIG. 1(a). The portion of the total MR head resistance that varies in accordance with a varying magnetic field is the sensor resistance $R_S$, with the resulting change in resistance being indicated as $\Delta R_S$. Resistance $R_S$ varies inversely proportional to the sensor height h. The total head lead resistance $R_l$ is the resistance of the wires to the preamplifier of the AE module and the resistance of the backleads BL inside the MR head. Lastly, the total front-lead resistance of the MR head is indicated as $R_f$. Resistance $R_f$ also varies inversely proportional to the sensor height h. However, $R_f$ shows no signal variations for varying magnetic field. Equations (1)–(4) represent these principles in symbolic notation.

$$R_H = R_l + R_f + R_S \quad (1)$$

$$R_f, R_S \, 1/h, \quad (2)$$

$$h = \text{sensor height}, \quad (3)$$

and $$R_S = R_{S0} \pm \Delta R_S \text{ (signal induced)}. \quad (4)$$

In FIGS. 1(a) and 1(b) and throughout the following disclosure, bias current $I_B$ equals head bias current $I_H$. The voltage $V_H$ is the bias voltage appearing across the total MR head resistance $R_H$. Voltage $V_B$ is the bias voltage appearing across sensor resistance $R_S$ and front lead resistance $R_f$. Voltage $V_S$ is the bias voltage appearing across sensor resistance $R_S$. Height h is the physical height of the sensor.

There are three conventional approaches for providing MR sensor biasing: a constant bias current scheme; a constant bias voltage scheme; and an adjusted bias current scheme for attaining constant bias voltage. The term "constant" as used when referring to biasing schemes indicates a biasing invariability from sensor to sensor in view of manufacturing tolerances. For a conventional constant bias current scheme, the same bias/sense DC current is applied to all MR heads by AE modules during manufacturing of a product regardless of the respective head resistances, sensor heights, etc., of the MR heads. FIGS. 2(a) and 2(b) illustrate an example of biasing conditions for an MR head for different sensor resistances $R_H$ for a conventional constant bias current $I_B$ scheme. If $I_B$ in FIG. 2(a) is 10 mA, for example, FIG. 2(b) shows that the head bias voltage $V_H$ varies accordingly between 200 mV and 500 mV as $R_H$ varies between 20 and 50 Ohms.

For a conventional constant bias voltage scheme, the same bias/sense DC voltage is applied to all MR heads in a product by an AE module. FIGS. 2(c) and 2(d) illustrate exemplary bias conditions for an MR head for different sensor resistances $R_H$ for a conventional constant bias voltage $V_H$ scheme. If the bias voltage $V_B$ appearing across the sensor resistance $R_S$ in FIG. 2(d) is 500 mV, for example, FIG. 2(c) shows that the bias current $I_H$ through the MR head varies inversely proportional to the total head resistance $R_H$.

U.S. Pat. No. 5,309,294 to Cahalan, issued May 3, 1994, discloses voltage biasing circuit that provides a constant bias voltage for an MR head. According to Cahalan, voltage biasing circuit includes a nulling circuit that adjusts the output of the voltage biasing circuit. The nulling circuit effectively increases the output of the voltage biasing circuit by an amount that is approximately equal to a cable drop across any parasitic cable resistances that are present. The Cahalan circuit uses a resistive element having a resistance that is an estimate of the parasitic cable resistance for generating the nulling voltage. This approach, however, does not compensate for any voltage drop appearing across the back-leads inside an MR head.

In the conventional adjusted bias current scheme for attaining a constant bias voltage, the bias current through the MR head is adjusted during manufacturing to be inversely proportional to the MR head resistance $R_H$, achieving an essentially constant MR head bias voltage. The resistance $R_H$ must be measured during the manufacturing process.

None of these conventional MR head biasing scheme compensate for variations in physical characteristics of the MR head that occur during the manufacturing process, specifically, the sensor dimension tolerances. Consequently, operation of an MR head biased by a conventional biasing scheme is typically not at or near the operational optimum for the head. Further, uniform magnetic performance from MR head to MR head of a product, that is, less variability in magnetic performance from head to head regardless of manufacturing tolerances, is not typically achieved.

SUMMARY OF THE INVENTION

It is an object of the present invention to provide an MR head biasing scheme that generally allows for variations in the physical characteristics of an MR sensor occurring during manufacturing, specifically for the physical tolerances of the head occurring during manufacturing. In this regard, the present invention allows for operation of an MR head at or closer to the operational optimum of the MR sensor, and achieves a more uniform magnetic performance from sensor to sensor regardless of physical variations within manufacturing tolerances than conventional biasing schemes.

It is another object of the present invention to provide a sensor biasing scheme that does not rely on head resistance $R_H$ measurements. Consequently, it is an object of the present invention to make use of a "head model" that is based on the head lead resistance $R_l$ and the bias voltage $V_B$ appearing across the sensor resistance $R_S$ portion of the total head resistance $R_H$ that is inversely proportional to the sensor height h and that is varying with the magnetic data signal. Additionally, it is an object of the present invention to use a controlled current source to achieve constant current density $J_S$ in an MR sensor and a constant temperature rise of an MR sensor, regardless of sensor height h. Consequently, maximum allowable bias is provided for all heads in a product with respect to limits set in accordance with electromigration and interdiffusion. It is an object of the present invention for the MR sensor biasing schemes of the invention to be used in conjunction with a signal current sensing (low input impedance) readback amplifier ($|Z_{in}| << R_H$), as well as with a signal voltage sensing high input impedance readback amplifier ($|Z_{in}| >> R_H$).

To achieve these and other objects, one embodiment of the present invention provides a bias circuit that generates a bias current $I_B$ and a bias voltage $V_H$ for a magnetoresistive (MR) transducer. The bias voltage $V_H$ is a voltage produced by the bias current $I_B$ flowing through a total resistance $R_H$ of the MR transducer, where the total resistance $R_H$ is the sum of a sensor resistance $R_S$, a total head lead resistance $R_l$, and a total front-lead resistance $R_f$. This embodiment of the present invention includes a multiplier, a comparator, a controller and a current generator. The multiplier has first and second inputs in which the first input receives a first signal that is related to the bias current $I_B$ and the second input receives a second signal that is related to the bias voltage $V_H$. The multiplier generates a product signal that is proportional to a product of the first and second signals. The comparator compares the product signal to a reference signal that is proportional to a predetermined bias power $P_B$ dissipated by the MR transducer, and generates a control signal. The controller is responsive to the control signal by controlling one of the bias current $I_B$ and the bias voltage $V_H$ or both $I_B$ and $V_H$. and as a result controls the bias power $P_B$ dissipated by the MR transducer to a predetermined value. Preferably, the controller is responsive to the control signal by controlling the current generator to generate the bias current $I_B$.

According to the invention, the multiplier includes a current sink circuit and a differential amplifier. An input of the current sink circuit receives the second signal and, in response, the current sink circuit generates an output current that is proportional to the bias voltage $V_H$. The differential amplifier has an input and an output, and is biased by the output current of the current sink circuit. The differential amplifier input receives the first signal and the differential amplifier output is therefore proportional to a product of the bias current $I_B$ and the bias voltage $V_H$. More specifically, the current sink circuit includes a first transistor having first, second and third nodes, and a first resistor. The second signal is coupled to the first node of the first transistor. The first resistor is coupled between the second node of the first transistor and a first power supply node. The differential amplifier includes second and third transistors, and second and third resistors. The second and third transistors each have first, second and third nodes, where the first signal is coupled between the first node of each of the second and third transistors. The second node of each of the second and third transistors are coupled to the third node of the first transistor. The second resistor is coupled between the third node of the second transistor and the second power supply node, while the third resistor is coupled between the third node of the third transistor and the second power supply node. The output of the differential amplifier appears between the third node of the second transistor and the third node of the third transistor. Preferably, the comparator is an adder circuit coupled to the third node of the second transistor and the third node of the third transistor. The adder circuit adds to the output of the differential amplifier a predetermined current signal that is related to the reference signal.

Another embodiment of the present invention provides a biasing circuit for a magnetoresistive (MR) transducer, where the transducer is defined as having a total resistance $R_H$. Resistance $R_H$ includes a sensor resistance $R_S$, a lead resistance $R_l$ and a front-lead resistance $R_f$. The biasing circuit includes a transducer equivalent circuit, a difference sensing circuit, and first and second current sources. The transducer equivalent circuit includes a voltage source and an input resistance. The voltage source has a predetermined voltage and the input resistance has a resistance that is related to the lead resistance $R_l$ of the MR transducer. The difference sensing circuit has first and second inputs, with the first input being coupled to the MR transducer and the second input being coupled to the transducer equivalent circuit. The difference sensing circuit senses a voltage difference between the first and second inputs. The first current source is responsive to the difference sensing circuit by generating a bias current $I_B$ for the MR transducer. Similarly, the second current source is responsive to the difference sensing circuit by generating a control current that is coupled to the transducer equivalent circuit. According to the invention, the control current is proportional to the MR transducer bias current $I_B$ so that the predetermined voltage of the voltage source equals a predetermined voltage $V_B$ appearing across the sensor resistance $R_S$ in series with the front lead resistance $R_f$.

Since both $R_S$ and $R_f$ are inversely proportional to the sensor height h, the constant voltage appearing across $R_S$ and $R_f$ also provides a constant (i.e. sensor height independent) voltage across $R_S$.

In one configuration of the second embodiment, the difference sensing circuit includes first and second transistors each having first, second and third nodes. The first node of first transistor is coupled to the first and third nodes of the second transistor. The second node of the first transistor is coupled to the MR transducer. The second node of the second transistor is coupled to the transducer equivalent circuit. The first current source includes a third transistor having first, second and third nodes. Similarly, the second current source includes a fourth transistor having first, second and third nodes. The first and third nodes of the third transistor are coupled to the first node of the fourth transistor to form a current mirror. The third node of the third transistor is coupled to the third node of the first transistor, and the third node of the fourth transistor is coupled to the third node of the second transistor. For power considerations, an area ratio of the first transistor to the second transistor is preferably N:1 and, similarly, an area ratio of the third transistor to the fourth transistor is preferably N:1.

In another configuration of the second embodiment, the first current source includes a first transistor having first, second and third nodes, and, likewise, the second current source includes a second transistor having first, second and third nodes. The first node of the first transistor and the first node of the second transistor are each coupled to an output of the difference sensing circuit. The third node of the first transistor is coupled to the MR transducer, and the third node of the second transistor is coupled to the MR transducer equivalent circuit. The biasing circuit of this embodiment also includes an output circuit that has first and second input nodes and an output node. The first input node of the output circuit is coupled to the third node of the first transistor and the second input node of the output circuit is coupled to the third node of the second transistor.

In yet another configuration of the second embodiment of the present invention, the difference sensing circuit includes first and second transistors each having first, second and third nodes. The first node of first transistor is coupled to the first and third nodes of the second transistor. The second node of the first transistor is coupled to the MR transducer and the second node of the second transistor is coupled to the transducer equivalent circuit. The first current source includes third and fourth transistors each having first, second and third nodes. The second node of each of the third and fourth transistors are coupled to the third node of the first transistor. The second current source includes a fifth transistor having first, second and third nodes. The first node of the third transistor is coupled to the first and third node of the fifth transistor to form a current mirror, while the second node of the fifth transistor is coupled to the third node of the second transistor. Preferably, an area ratio of the first transistor to the second transistor is N:1, and a current ratio of current flowing in the second node of the fourth transistor to the current flowing in the second node of the third transistor to the current flowing in the second node of the fifth transistor K:L:1, where K+L equals N.

Still another configuration of the second embodiment includes a current sensing circuit and a third current source. The current sensing circuit senses the bias current $I_B$ generated by the first current source for the predetermined bias voltage $V_S$ appearing across the sensor resistance $R_S$. The third current source is responsive to the current sensing circuit by generating an output current when the bias current $I_B$ generated by the first current source for the predetermined bias voltage $V_S$ is less than a predetermined sensor bias current. The output current generated by the third current source is coupled to the transducer equivalent circuit and combined with the control current generated by the second current source to form a combined control current. The combined control current is related to the MR transducer bias current $I_B$ such that a predetermined MR transducer bias current $I_B$ flows through the sensor resistance $R_S$ producing a predetermined effective magnetic bias of the sensor resistance $R_S$.

Preferably for this configuration, the difference sensing circuit includes first and second transistors each having first, second and third nodes. The first node of first transistor is coupled to the first and third nodes of the second transistor. The second node of the first transistor is coupled to the MR transducer, and the second node of the second transistor is coupled to the transducer equivalent circuit. The first current source includes a third transistor having first, second and third nodes, and the second current source includes a fourth transistor having first, second and third nodes. The first and third nodes of the third transistor is coupled to the first node of the fourth transistor to form a current mirror. The third node of the third transistor is coupled to the third node of the first transistor, and the third node of the fourth transistor is coupled to the third node of the second transistor.

The current sensing circuit includes a fifth transistor, a fourth current source, and an amplifier circuit. The fifth transistor has first, second and third nodes, with the first node being coupled to the third node. The fourth current source is coupled to the third node of the fifth transistor. The amplifier circuit has a first input, a second input and an output. The first input of the amplifier is coupled to the third node of the third transistor. The second input is coupled to the third node of the fifth transistor and the amplifier output is coupled to the third current source.

A third embodiment of the present invention provides a circuit for magnetically biasing a magnetoresistive (MR) transducer. The biasing circuit includes a transducer equivalent circuit, a difference sensing circuit, and first and second current sources. The difference sensing circuit has first and second inputs, with the first input being coupled to the MR transducer and the second input being coupled to the transducer equivalent circuit. The difference sensing circuit senses a voltage difference between the first and second inputs. The first current source is responsive to the difference sensing circuit by generating a bias current $I_B$ for the MR transducer. The second current source is responsive to the difference sensing circuit by generating a control current that is coupled to the transducer equivalent circuit. According to the invention, the control current is proportional to the MR transducer bias current $I_B$ so that the bias current $I_B$ through the MR transducer produces a predetermined effective magnetic bias of a sensor portion of the MR transducer.

The biasing circuit also includes a current sensing circuit and a third current source. The current sensing circuit senses the bias current $I_B$ generated by the first current source for the predetermined effective magnetic bias of the sensor portion of the MR transducer. The third current source is responsive to the current sensing circuit by generating an output current when the bias current $I_B$ generated by the first current source for the predetermined effective magnetic bias of the sensor portion of the MR transducer is less than a predetermined sensor bias current. The output current generated by the third current source is then coupled to the transducer equivalent circuit and combined with the control current generated by the second current source to form a combined control current. The combined control current is related to the MR transducer bias current $I_B$ so that a predetermined MR transducer bias current $I_B$ flows through the MR transducer producing the predetermined effective magnetic bias of the sensor portion of the MR transducer.

Preferably, the difference sensing circuit includes first and second transistors each having first, second and third nodes. The first node of the first transistor is coupled to the first and third nodes of the second transistor. The second node of the first transistor is coupled to the MR transducer, and the second node of the second transistor being coupled to the transducer equivalent circuit. The first current source includes a third transistor having first, second and third nodes. Similarly, the second current source includes a fourth transistor having first, second and third nodes. The first and third nodes of the third transistor are coupled to the first node of the fourth transistor forming a current mirror. The third node of the third transistor is coupled to the third node of the first transistor. The third node of the fourth transistor is coupled to the third node of the second transistor.

The current sensing circuit includes a fifth transistor, a fourth current source and an amplifier circuit. The fifth transistor has first, second and third nodes, with the first node being coupled to the third node. The fourth current source is coupled to the third node of the fifth transistor. The amplifier circuit has a first input, a second input and an output. The first input is coupled to the third node of the third transistor. The second input is coupled to the third node of the fifth transistor. The amplifier output is coupled to the third current source.

The biasing circuits of the present invention can be part of an MR/AE circuit which is part of a disk drive.

BRIEF DESCRIPTION OF THE DRAWINGS

The present invention is illustrated by way of example and not limitation in the accompanying figures in which like reference numerals indicate similar elements and in which:

FIGS. 2(c) and 2(d) illustrate exemplary bias conditions for different sensor resistances $R_H$ for an MR head for a conventional constant bias voltage $V_H$ approach;

FIGS. 3(a) and 3(b) show exemplary bias conditions for varying sensor resistance $R_H$ for a constant bias power $P_B$ approach according to the present invention;

DETAILED DESCRIPTION OF THE PREFERRED EMBODIMENTS

Figure 1A:
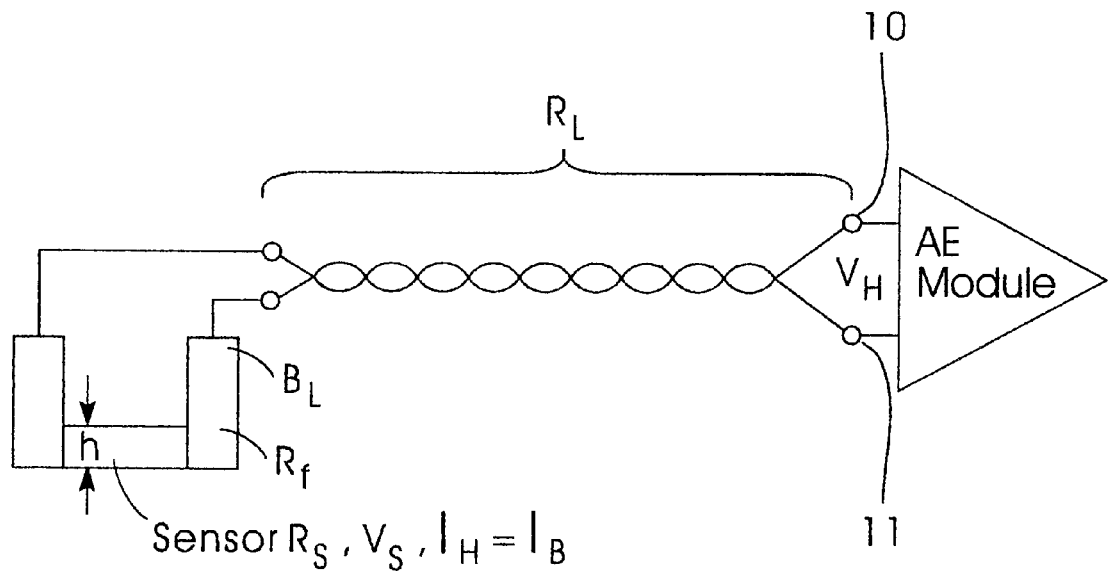
FIG. 1(a) shows the physical relationship between the different resistances forming the total MR head resistance $R_H$.
Figure 1B:
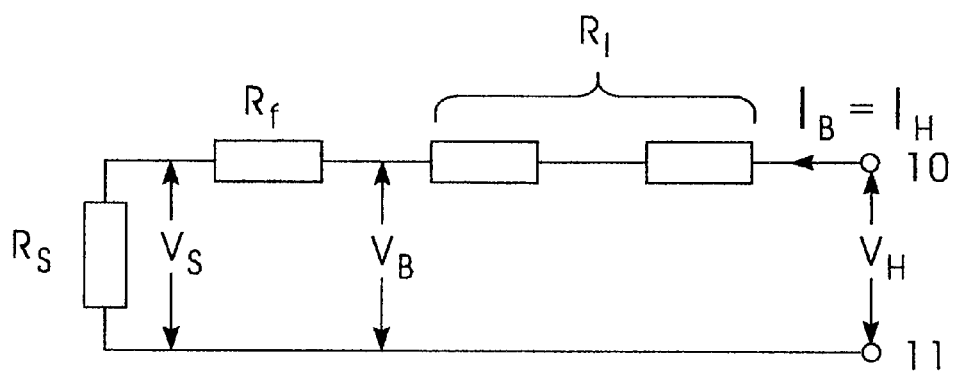
FIG. 1(b) shows a schematic diagram for an electrical model of resistance $R_H$.
Figure 2A:
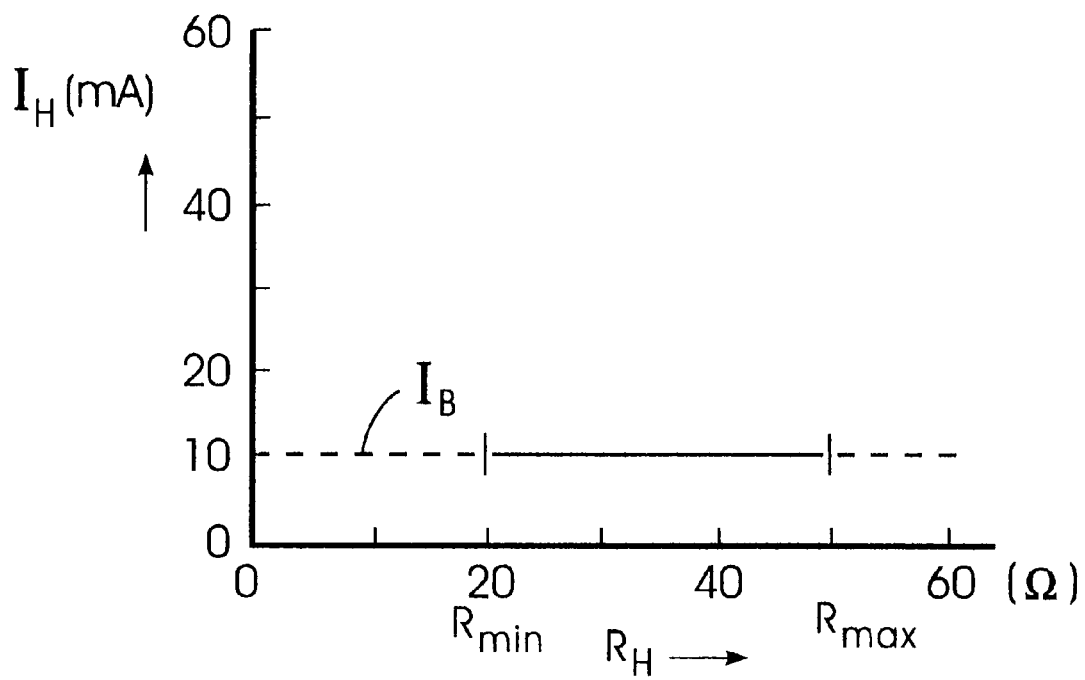
FIGS. 2(a) and 2(b) illustrate exemplary bias conditions for different sensor resistances $R_H$ for an MR head for a conventional constant bias current $I_B$ approach.
Figure 2B:
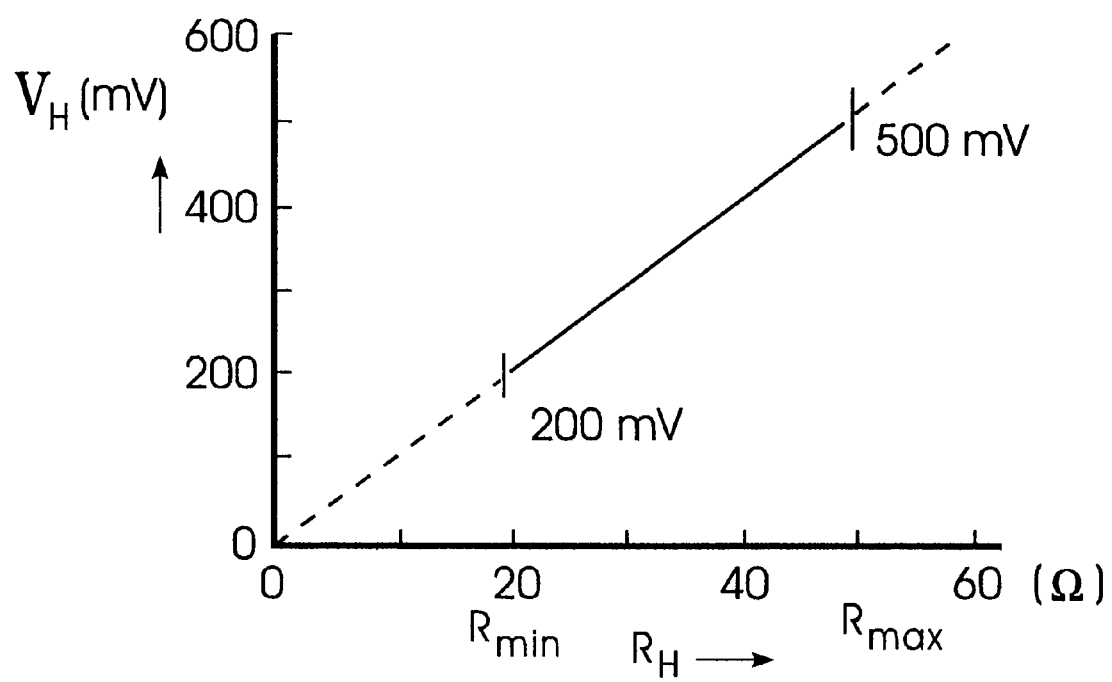

The present invention provides an MR head biasing scheme that compensates for physical variations from head to head within manufacturing tolerances of the head using one of five related approaches. The first approach is to electrically bias an MR head so that the (electrical) power dissipation in the head is kept constant from head to head, regardless of variations in total head resistance $R_H$ due to manufacturing tolerances. This is accomplished by keeping the product of the DC voltage across the head $V_H$ and the DC current through the head $I_H$ constant. That is, $$V_H I_H = P_B = \text{a constant} \tag{5}$$

where, $P_B$ is the bias power.

FIGS. 3(a) and 3(b) show exemplary bias conditions for varying total head resistance $R_H$ for a constant bias power $P_B$ approach according to the invention. FIG. 3(a) shows variations in head current $I_H$ for variations in total head resistance $R_H$ for a constant bias $P_B$. FIG. 3(b) shows corresponding variations in voltage across the head $V_H$ for variations in total head resistance $R_H$ for the same constant bias $P_B$. An advantage of a constant bias power scheme over a conventional constant bias voltage approach is that increases in head current $I_H$ caused by larger sensor heights are less dramatic with a constant bias power scheme. Additionally, a constant power biasing technique is useful for avoiding magnetic underbiasing of low sensor height heads (high $R_H$) due to a sensor demagnetization effect. This is because the head voltage $V_H$ does not remain constant for constant $P_B$ bias, but increases slightly for higher resistance heads.

A second biasing approach of the present invention is a constant MR sensor current density scheme. With this bias technique, the current density $J_S$ in the MR sensor is held constant. This allows operation of all MR sensors in a product as close as possible to the electro-migration limits. The electro-migration depends on current density, $$J_s = V_s \frac{1}{\rho l} = I_s \frac{1}{ht} = \text{constant} \tag{6}$$

where
$\rho$=sensor resistivity,
l=sensor length,
h=sensor height,
t=sensor thickness,
$V_S$=the voltage across the sensor, that is, the portion of the MR head corresponding to resistance $R_S$ and responsive to the magnetic data, and $I_S$=the current through the sensor (which equals the current through the entire MR head $I_H$).

The sensor resistance is given by $$R_s = \rho \frac{l}{ht} \quad (7)$$

The (electrical) power dissipation in the sensor is therefore $$P_S = J_S^2 \rho l t h \quad (8)$$

The temperature rise $\Delta T_S$ of the sensor due to the electrical power dissipation is $$\Delta T_S = P_S \times R_{thermal} \quad (9)$$

where $R_{thermal}$ is the thermal resistance of the sensor to ambient.

The sensor cools by heat diffusing away from the sensor through the two-side surfaces facing the shields. The thermal resistance resulting from this facial cooling is inversely proportional to the sensor height h. Another cooling mechanism is by heat diffusion into the leads of the sensor. The thermal resistance associated with this cooling mechanism is also inversely proportional to the sensor height h. Hence, the total thermal resistance $R_{thermal}$ in equation (9) is inversely proportional to the sensor height h.

$$R_{thermal} = \frac{K}{h} \quad (10)$$

where K is an arbitrary constant. Therefore, $$\Delta T_S = J_S^2 \rho l t K \quad (11)$$

is no longer a function of the sensor height h. Consequently, if the biasing circuitry of an MR sensor is designed to bias at a constant current density $J_S$, all MR sensors in a product will be operating at the same temperature rise $\Delta T_S$ above ambient.

A third biasing approach of the present invention provides a constant MR sensor bias voltage $V_S$. For this scheme, the voltage $V_S$ across the sensor, that is the portion of the MR head corresponding to resistance $R_S$ and responsive to the magnetic data, is held constant for all MR heads in a product.

Rewriting equation (12) with:

$$P_s = V_s^2 \frac{1}{R_s} = V_s^2 \frac{th}{\rho l} \quad (12)$$

results in $$\Delta T_s = V_s^2 \frac{t}{\rho l} K \quad (13)$$

It also follows that for constant sensor voltage biasing, the sensor temperature rise is the same for all sensors in a product.

With $$I_s = J_s h t = \frac{V_s}{R_s}, \quad (14)$$

the current density of the sensor $J_S$ is $$J_S = V_S / \rho l. \quad (15)$$

Hence, if $V_S$ is held constant for all heads within a product, $J_S$ is also held constant for heads within the same product. Thus, both the constant MR sensor current density bias scheme of the invention and the constant MR sensor bias voltage scheme of the present invention are identical. It should be understood that constant voltage biasing of an MR sensor is not the same as conventional constant voltage biasing of an entire MR head, which does not produce the advantages of constant temperature rise and constant current density.

A fourth MR sensor biasing approach of the present invention is a constant MR sensor temperature rise bias scheme. This MR sensor biasing technique leads to the same sensor temperature rise (resulting from the electrical bias power dissipation in the sensor) of all heads in a product. Naturally, this biasing approach is the same as the two previous biasing approaches of the present invention. Since constant sensor temperature rise biasing, constant sensor current density biasing, and constant sensor bias voltage biasing are all independent of sensor height h, these three biasing approaches of the present invention can all be treated as the same case. Since $$R_H = R_l + R_f + R_S \quad (16)$$

and $$R_f, R_S \, 1/h, \quad (17)$$

a constant voltage bias across the front-lead resistance $R_f$ and the sensor resistance $R_S$, that is across $R_f + R_S$, will also produce a constant current density in the sensor and provide a constant temperature rise for all sensors in a product, regardless of sensor height h. Therefore, a constant sensor temperature rise can be obtained in principle as indicated by the schematic block diagrams of FIGS. 4(a)–4(d).

Figure 4A:
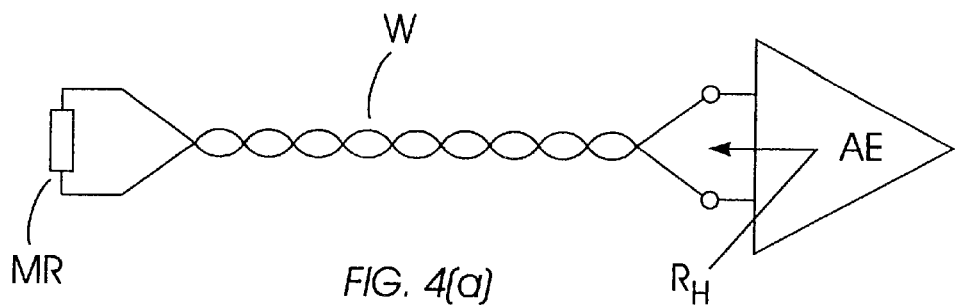
FIG. 4(a) shows a schematic block diagram of an MR head connected to an arm electronics module.
Figure 4B:
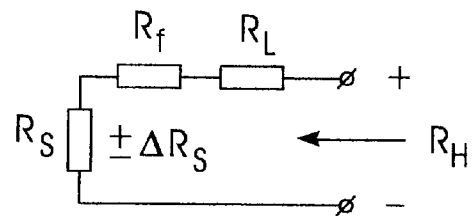
FIG. 4(b) shows an equivalent circuit for an MR head according to the present invention.
Figure 4C:
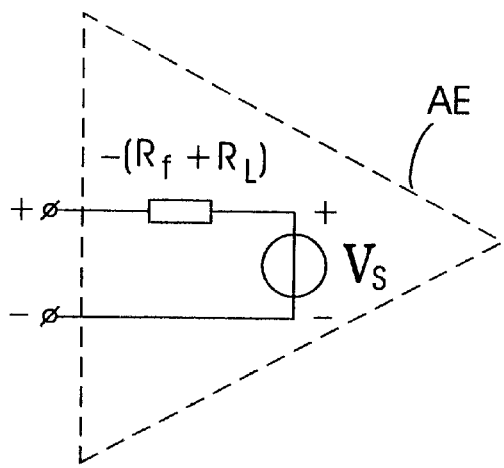
FIGS. 4(c) and 4(d) show equivalent circuits according to the present invention for a bias voltage source $V_S$ having a negative input resistance.
Figure 4D:
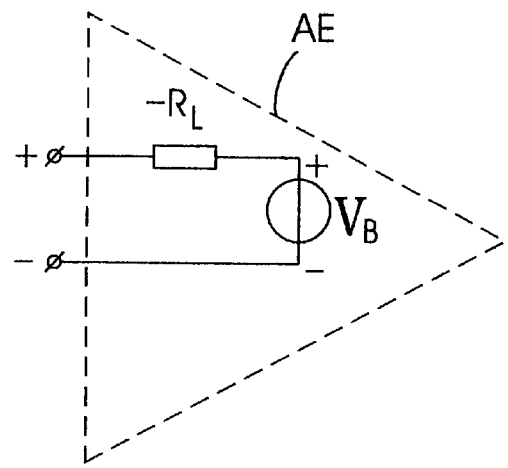

FIG. 4(a) shows a schematic block diagram of an MR head, an AE module and wires W connected between the MR head and AE module. FIG. 4(b) shows an equivalent circuit for an MR head with leads and wires. According to the invention, the MR head "sees" a bias voltage source having a negative input resistance at the input terminals of the AE module. FIG. 4(c) shows an equivalent bias circuit where a voltage $V_S$ is developed across the sensor resistance $R_S$ of the MR sensor. FIG. 4(d) shows an equivalent bias circuit where a voltage $V_B$ is developed across the sensor resistance $R_S$ and the lead front-end resistance $R_f$. The equivalent circuit shown in FIG. 4(c), where the input resistance is $-(R_f + R_l)$, is relatively difficult to realize because $R_f \, 1/h$ and is dependent on each individual head. $R_l$, on the other hand, is relatively constant. Consequently, the equivalent circuit shown in FIG. 4(d), having a bias voltage $V_B$ and an input resistance $-R_l$, is the preferred implementation for a biasing circuit that provides biasing for the second, third and fourth biasing schemes of the present invention. The negative resistance $-R_l$ of the equivalent circuit in FIG. 4(d) cancels $R_l$ of the MR head wiring and leads, and effectively applies the bias voltage $V_B$ across $R_S + R_f$ of the MR head.

Figure 5A:
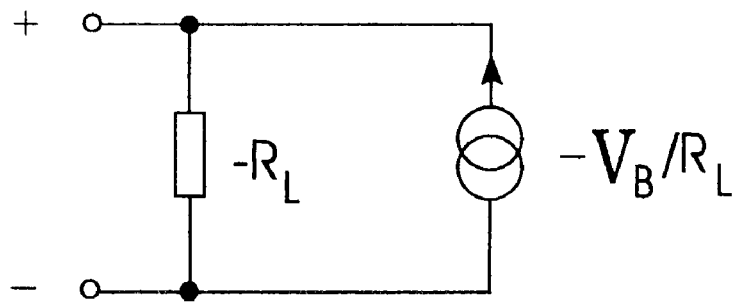
FIGS. 5(a)–5(c) show schematic block diagrams of equivalent circuits for the biasing circuit of FIG. 4(d)
Figure 5B:
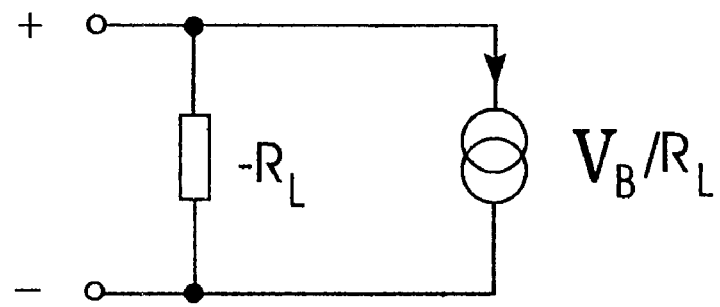
Figure 5C:
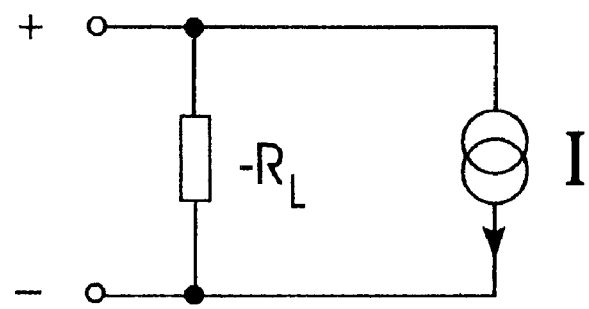
Figure 6A:
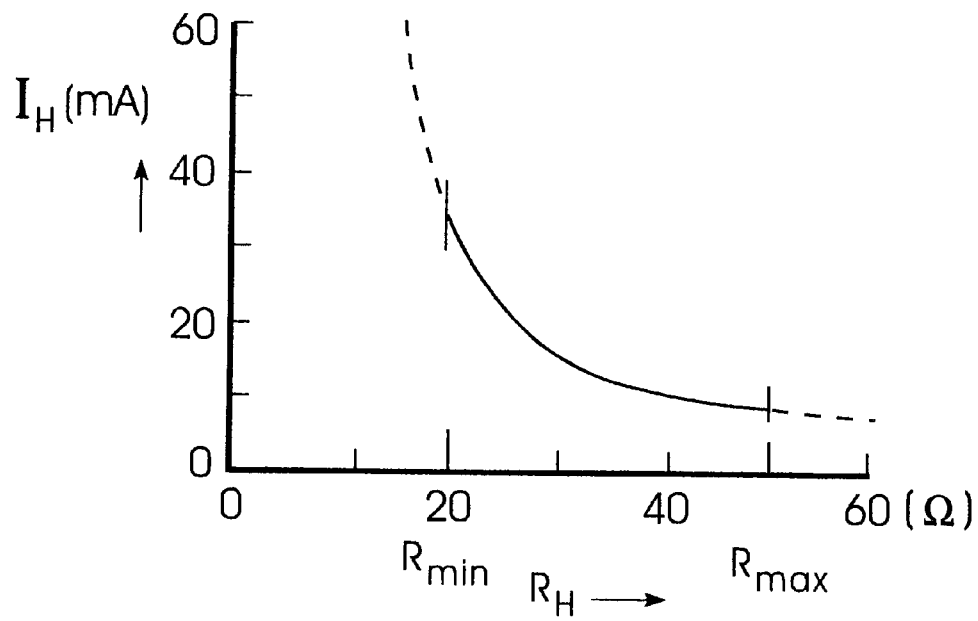
FIGS. 6(a) and 6(b) show exemplary biasing conditions for an MR head for a constant sensor temperature rise biasing approach according to the present invention.
Figure 6B:
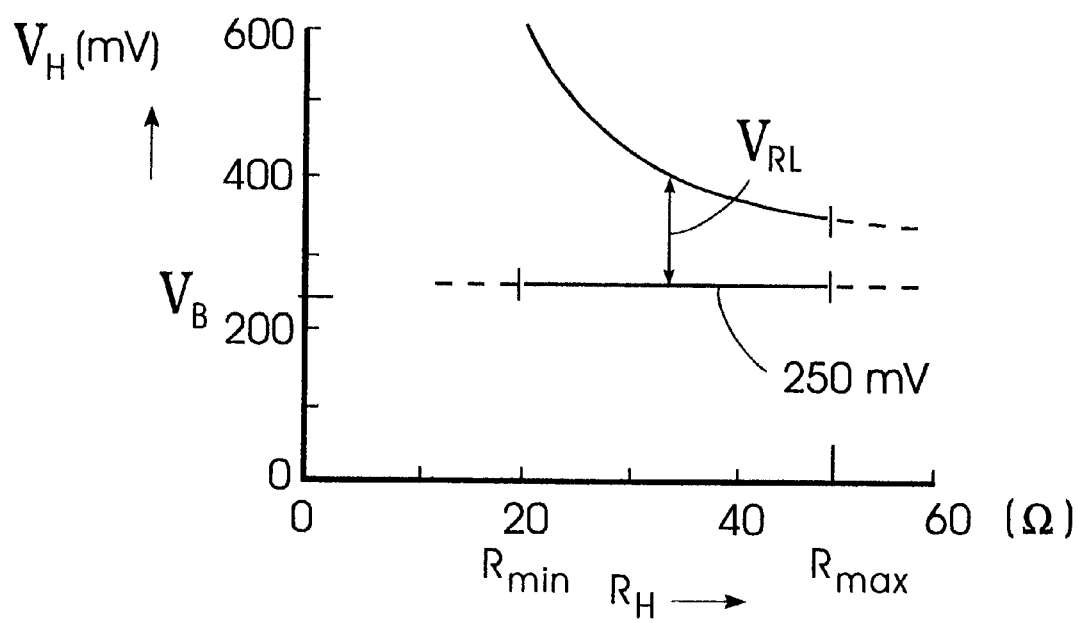

FIGS. 5(a)–5(c) are equivalent circuit models for the circuit of FIG. 4(d). In FIG. 5(c), the current source I and the negative input impedance $-R_l$ result in a constant bias voltage $V_B$ across $(R_S + R_f)$ of the MR head, shown in FIG. 4(b), when $I = V_B / R_l$. FIGS. 6(a) and 6(b) show exemplary biasing conditions for a constant sensor temperature rise biasing scheme according to the present invention. In FIG. 6(a), sensor current $I_H$ is shown for varying total MR head resistance $R_H$ for a constant sensor temperature rise biasing. FIG. 6(b) shows a graph of head bias voltage $V_H$ for varying MR head resistance $R_H$ for the same conditions. The curves of FIGS. 6(a) and 6(b) are described by:

$$I_H = V_B/(R_S + R_l), \tag{18}$$

and $$V_H = V_B + I_H R_l. \tag{19}$$

The effective magnetic bias caused by a constant current density $J_S$ in a sensor becomes progressively less as the sensor height decreases due to a demagnetization effect on the top and bottom edges of the sensor. To obtain a constant effective magnetic bias in sensors having a relative smaller height, a fifth biasing approach according to the present invention provides a progressively larger sensor current density $J_S$ and which is given by the following polynomial approximation $$J_s = (J_{h0} - J_0)\left(\frac{h_0}{h}\right)^2. \tag{20}$$

Figure 7A:
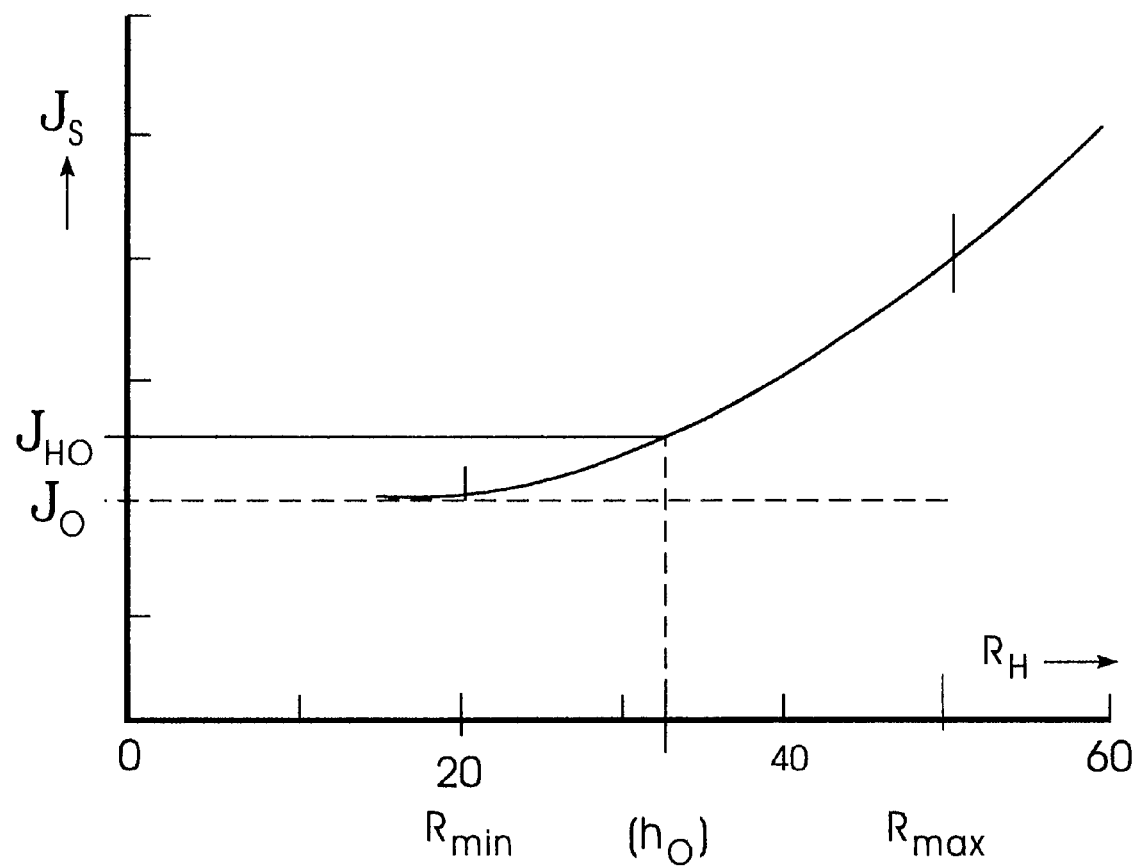
FIG. 7(a) shows theoretical biasing conditions for achieving a constant effective magnetic bias.
Figure 7B:
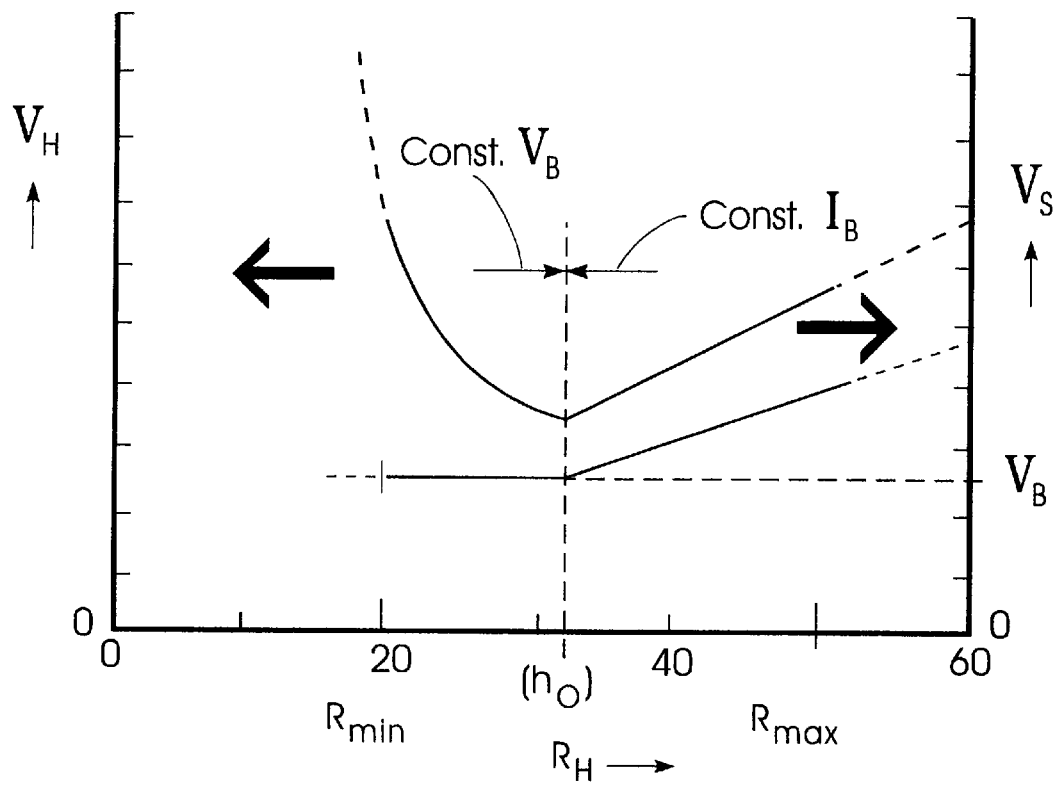
FIGS. 7(b) and 7(c) show biasing conditions for a practical approximation for achieving a constant effect magnetic bias according to the present invention.
Figure 7C:
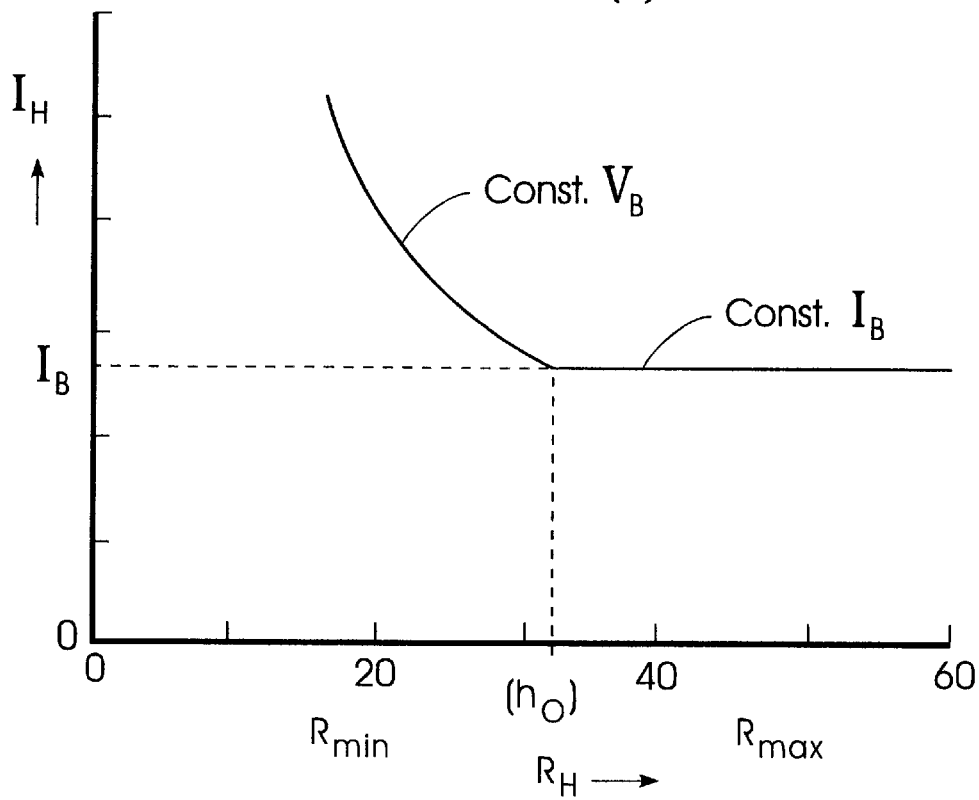

FIG. 7(a) shows a theoretical curve for $J_S$. FIGS. 7(b) and 7(c) show biasing conditions providing a practical approximation for a constant current density $J_S$ biasing according to the fifth biasing scheme of the present invention. Below a head resistance $R_{H0}$, corresponding to a sensor height $h_0$, a head is biased with a constant bias voltage yielding a constant current density $J_S$. Above resistance $R_{h0}$, a head is biased with a constant current $I_B$ resulting in an increase in a sensor current density that is inversely proportional to the sensor height $h$ and is proportional to the sensor resistance $R_S$.

Figure 8A:
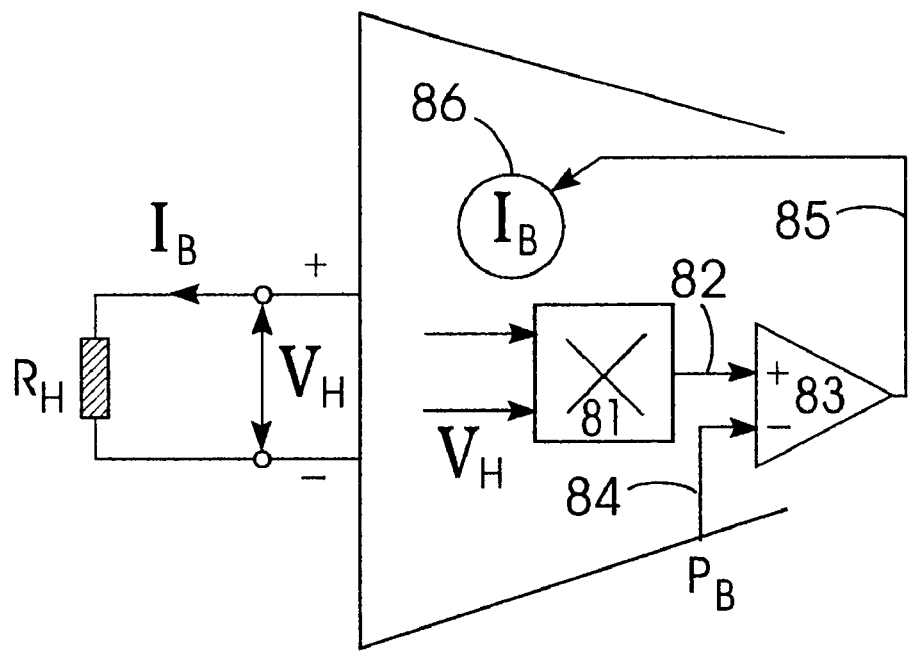
FIGS. 8(a) and 8(b) show schematic block diagrams for illustrating the general concept of constant MR head power biasing according to the present invention.
Figure 8B:
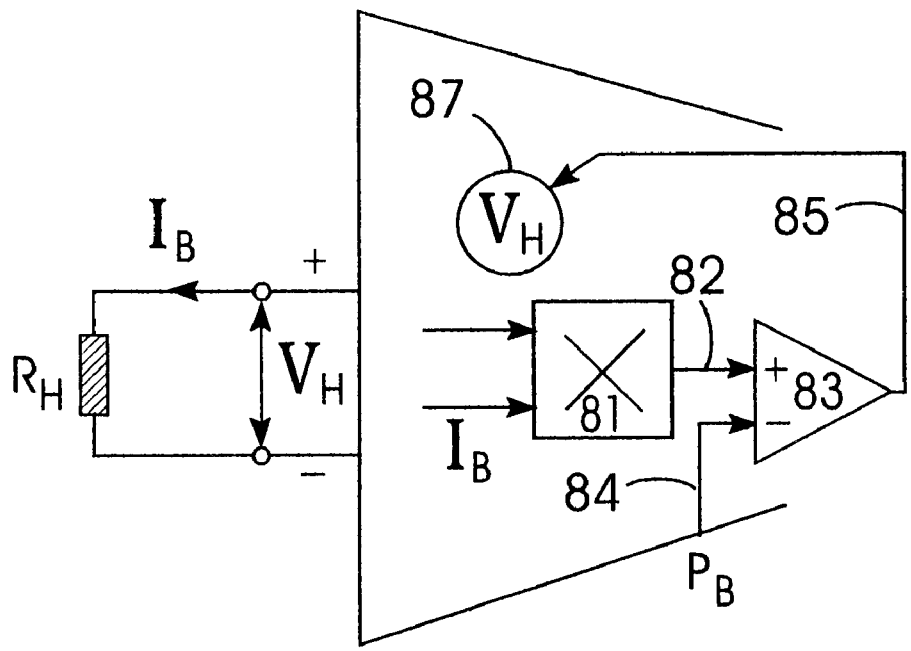

FIGS. 8(a) and 8(b) show schematic block diagrams for illustrating the general concept of the constant MR head power biasing scheme according to the present invention. Each electronic circuit shown in FIGS. 8(a) and 8(b) includes a multiplying device 81, for example, a well-known transconductance multiplier having a first input signal that is proportional to $I_B$ and a second input signal that is proportional to $V_H$. $I_B$ and $V_H$ are signals available at the input terminals of an AE module. The product signal output 82 from multiplier 81 is compared by a comparator 83 to a reference signal 84. Signal 84 is proportional to the desired bias power $P_B$ dissipated by MR head resistance $R_H$. Comparator 83 outputs a control signal 85 that is proportional to the difference of the product signal 82 and reference signal 84 and is used for controlling the bias current $I_B$ (FIG. 8(a)) or for controlling the head voltage $V_H$ (FIG. 8(b)) such that the product $I_B V_H$ is constant. In FIG. 8(a), the controlled variable is $I_B$ and variable $V_H$ is automatically linked to $I_B$ through the equation $V_H = R_H I_B$. The head resistance $R_H$ need not be a known value, that is, it may vary from head to head. For FIG. 8(b), the controlled variable is $V_H$ and the variable $I_B$ is linked to $V_H$.

Figure 9:
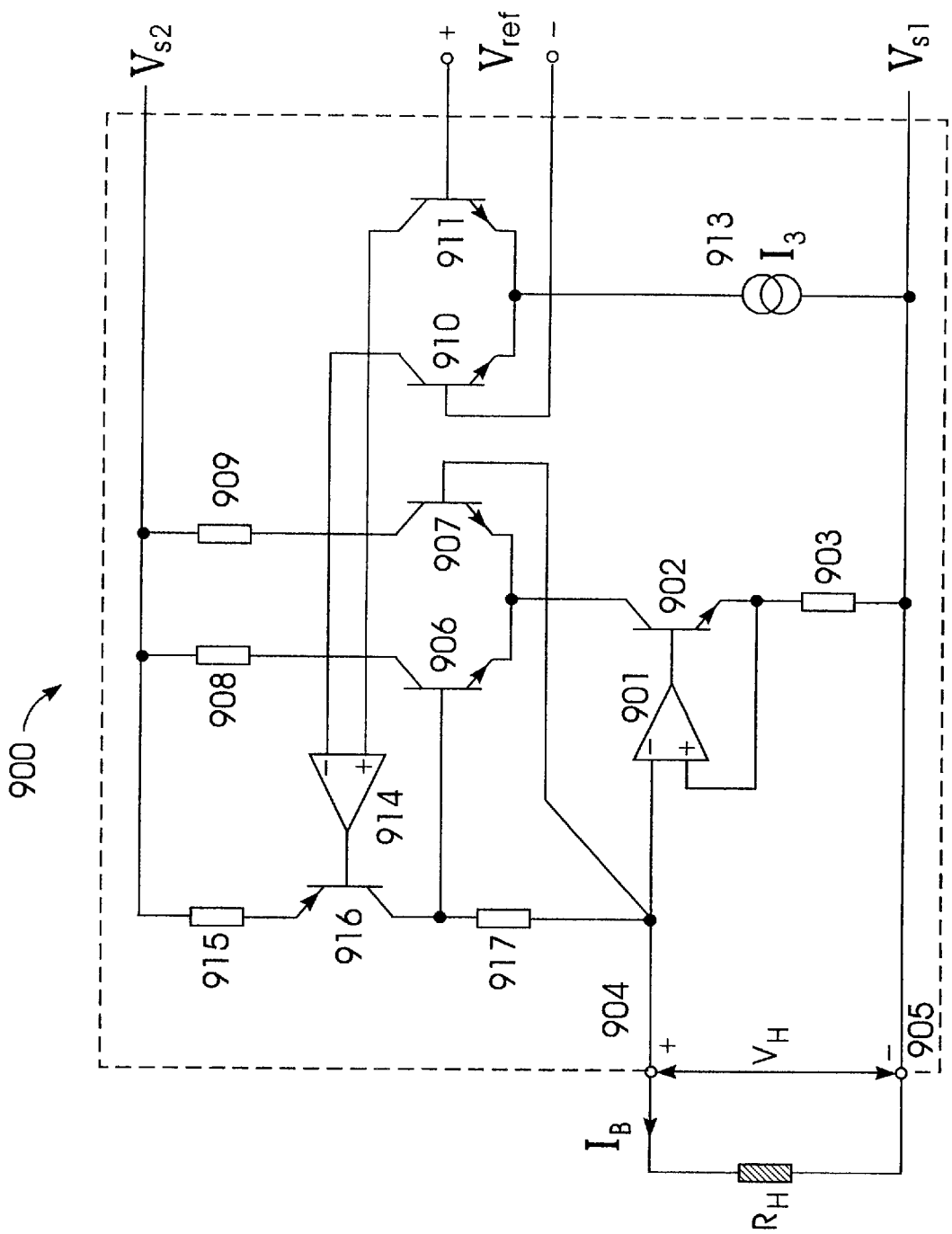
FIG. 9 shows a schematic block diagram of a bias circuit providing a constant bias power circuit for an MR head according to the present invention.

FIG. 9 shows a schematic block diagram of a bias circuit 900 that provides a constant bias power to an MR head. Bias circuit 900 includes a current sink formed by amplifier 901, transistor 902 and resistor 903. The output current of the current sink is proportional to head voltage $V_H$. As shown, the output of amplifier 901 is coupled to the base of transistor 902. The emitter of transistor 902 is coupled to the inverting input of amplifier 901 and to a first power source $V_{S1}$ through resistor 903. The non-inverting input of amplifier 901 is connected to input terminal 904 of bias circuit 900. Input terminal 905 of circuit 900 is coupled to power source $V_{S1}$. MR head ($R_H$) is connected across input terminals 904 and 905. Thus, the magnitude of the voltage $V_H$ appearing across $R_H$ is connected across the current sink and controls the magnitude of the collector current of transistor 902.

Transistors 906 and 907 are connected to form a first differential amplifier. That is, the emitters of transistors 906 and 907 are connected together and coupled to the collector of transistor 902. The bases of transistors 906 and 907 are coupled to opposite sides of a resistor 917. Resistor 917 is connected so that the current flowing through resistor 917 is the bias current $I_B$ that flows through terminal 904 and through $R_H$. The collector of transistor 906 is connected to a second power source $V_{S2}$ through resistor 908, while the collector of transistor 907 is connected to second power source $V_{S2}$ through resistor 909. The differential collector current of transistors 906 and 907 is proportional to $I_B V_H$.

A second differential amplifier is formed by transistors 910 and 911, and current source 913. The emitters of transistors 910 and 911 are connected together and coupled to one terminal of current source 913. The other terminal of current source 913 is connected to first power source $V_{S1}$. Current source 913 outputs current $I_3$ that is used for biasing transistors 910 and 911. The collector of transistor 910 is coupled to the collector of transistor 906, and the collector of transistor 911 is coupled to the collector of transistor 907. A reference voltage $V_{ref}$, which has a magnitude that is proportional to the desired bias power $P_B$, is applied between the bases of transistors 910 and 911 causing a constant differential current at the collectors of transistors 910 and 911 to be subtracted from the differential current output of transistors 906 and 907. The constant amount can be varied by varying $V_{ref}$. While FIG. 9 shows that $V_{ref}$ is externally applied to circuit 900, $V_{ref}$ can alternatively be made to have a constant magnitude, that is, internal to circuit 900, and $I_3$ can be made to be varied externally in proportion to the desired bias power $P_B$ for accommodating a wide range of products having different $P_B$ requirements.

The collector of transistor 906 is coupled to the inverting input to a control amplifier 914, and the collector of transistor 907 is coupled to the non-inverting input of control amplifier 914. The output of amplifier 914 controls a current source formed by transistor 916 and resistor 915. Transistor 916 and resistor 915 generate bias current $I_B$ that flows through resistor 917 and through head resistance $R_H$. With resistor $917 << kT/qI_B$ and $V_{ref} << kT/q$, it follows that $$P_B = V_H I_B \simeq I_3 V_{ref} \frac{R_1}{R_5}. \tag{21}$$

where $R_1$ and $R_5$ are the resistance of resistors 903 and 917, respectively.

Figure 10A:
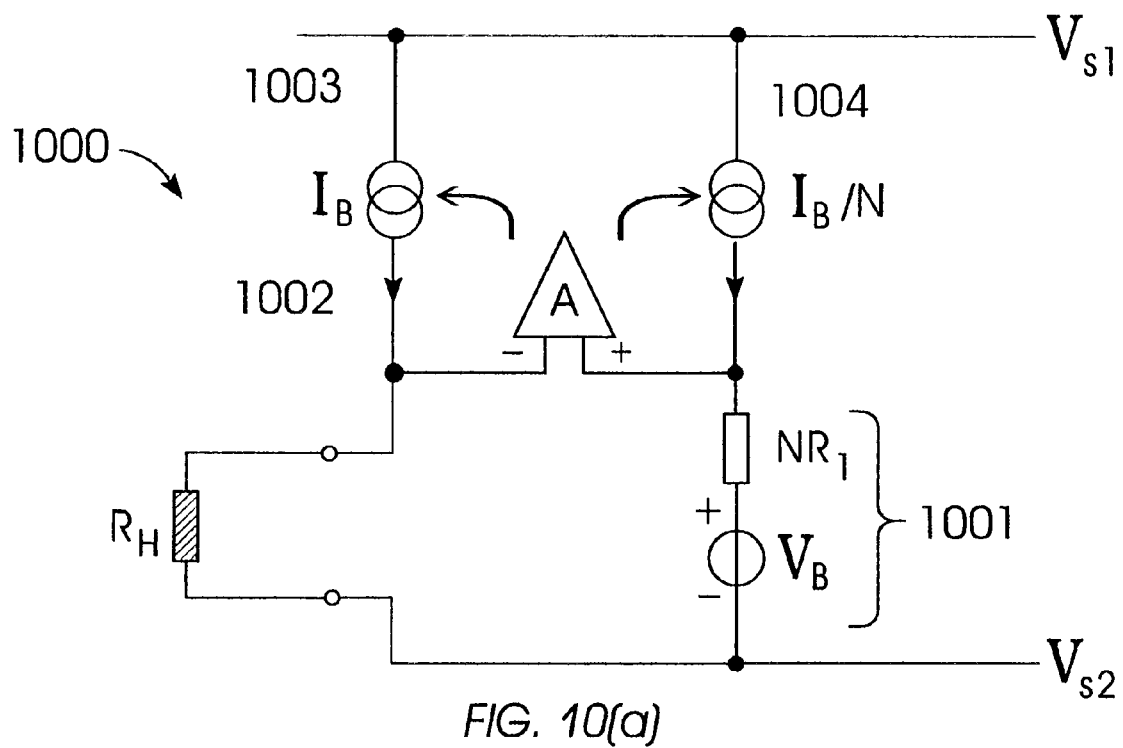
FIG. 10(a) shows a schematic block diagram of a circuit providing a constant voltage bias for the sensor resistance of an MR head according to the present invention.
Figure 10B:
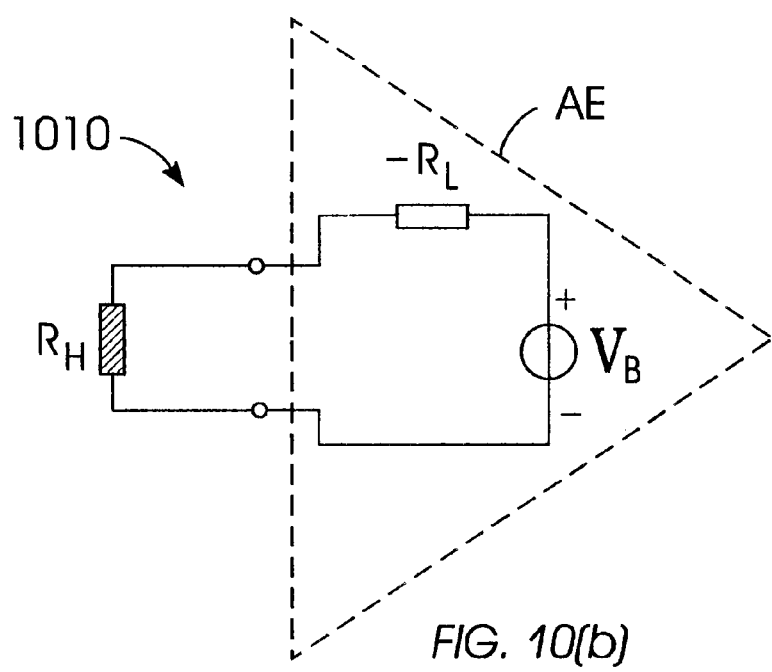
FIG. 10(b) shows a network equivalent circuit for the schematic block diagram of FIG. 10(a)

For a constant MR sensor bias voltage approach according to the present invention, only the resistance $R_S$ of the total MR head resistance $R_H$ is biased with a constant voltage. As demonstrated above, this biasing scheme also achieves a constant current density $J_S$ in the sensor in addition to a constant temperature rise of the sensor above ambient temperature. As indicated by FIGS. 4(a)–4(d), a constant sensor biasing can be implemented by compensating for the non-sensor resistance part of the head resistance, that is, the lead resistance $R_l$ and the front-lead resistance $R_f$, or more easily by compensating only for the lead resistance $R_l$ (see FIG. 4(d)). A simple and elegant way to achieve this is shown by FIGS. 10(a) and 10(b). FIG. 10(a) shows a schematic block diagram of a circuit 1000 providing a constant sensor voltage bias according to the present invention and FIG. 10(b) shows a network equivalent circuit 1010 for the schematic block diagram of FIG. 10(a).

In FIG. 10(a), the network equivalent circuit 1010 of FIG. 10(b) having a negative input resistance $-R_I$ with a voltage source $V_B$ is created by a bridge-like circuit 1000. Circuit 1000 includes an amplifier 1002 that senses a voltage difference between the total head resistance $R_H$ and the model or equivalent circuit 1001 for the MR transducer, that is, a circuit having a $NR_I$ in series. Amplifier 1002 adjusts two current sources 1003 and 1004 until the voltage difference sensed at the input to amplifier 1002 equals zero. Preferably, current source 1003 supplies current $I_B$ and current source 1004 supplies current $I_B/N$, where N is chosen to be greater than 1 for power savings considerations. However, N may be chosen other considerations in mind. Practical values for N are in the range from 5–20.

Figure 11:
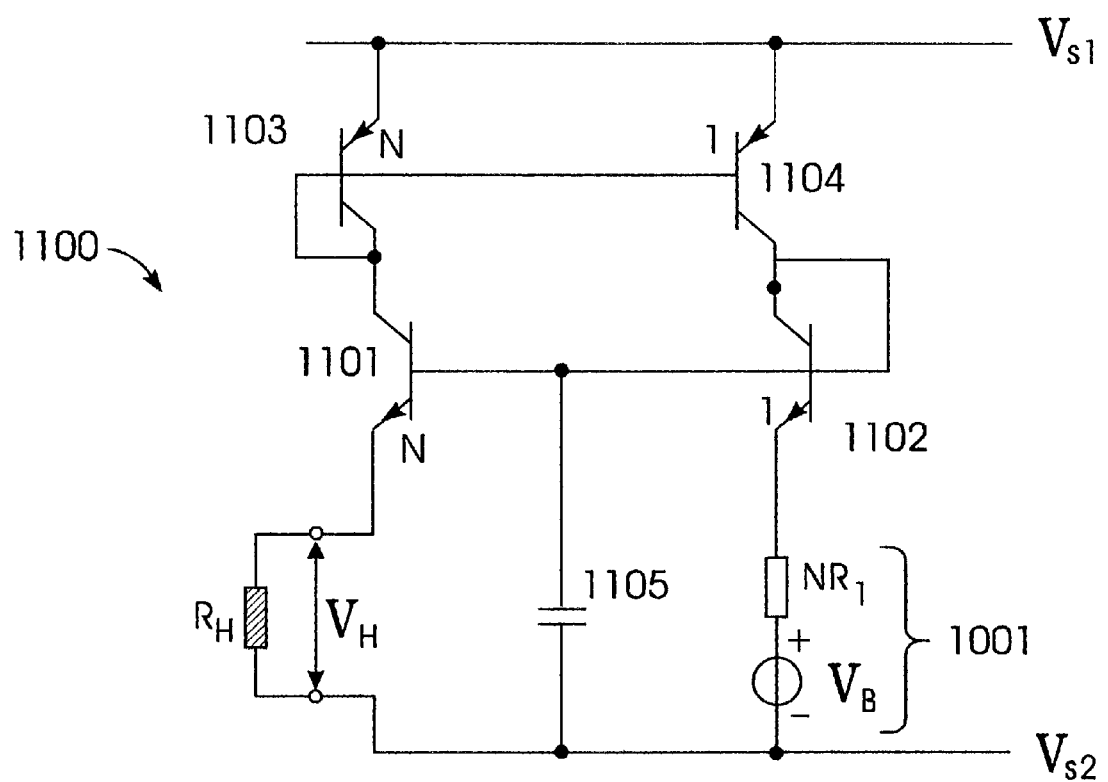
FIG. 11 shows an alternative schematic block diagram of a circuit providing a constant voltage across the sensor resistance portion of an MR head according to the present invention.

FIG. 11 shows a schematic block diagram of a circuit 1100 providing a constant voltage $V_B$ across the sensor resistance $R_S$ portion of an MR head. Circuit 1100 includes a transistor 1101 connected as an emitter follower. The base-emitter voltage of transistor 1101 is cancelled by the base-emitter voltage of transistor 1102, which has an area preferably N times smaller than $T_1$ transistor 1101 for power saving considerations. The resistance $NR_I$ of equivalent circuit 1001 is scaled accordingly by N. Transistor 1101 is preferably the input transistor of the readback amplifier of an AE module. Although not shown in FIG. 11, the readback signal is detected at the collector of transistor 1101. Capacitor 1105 is connected between the bases of transistors 1101 and 1102 and power source $V_{S2}$ for providing filtering. $NR_I$ and $V_B$ can be provided off-chip for greater flexibility. A current mirror is formed by transistors 1103 and 1104, and is connected in any well-known current mirror configuration (double FET mirror, etc.), and is also scaled by a factor N. This current mirror forces the currents through transistors 1101 and 1102, and also through $R_H$ and model 1001 to be scaled by N.

Figure 12:
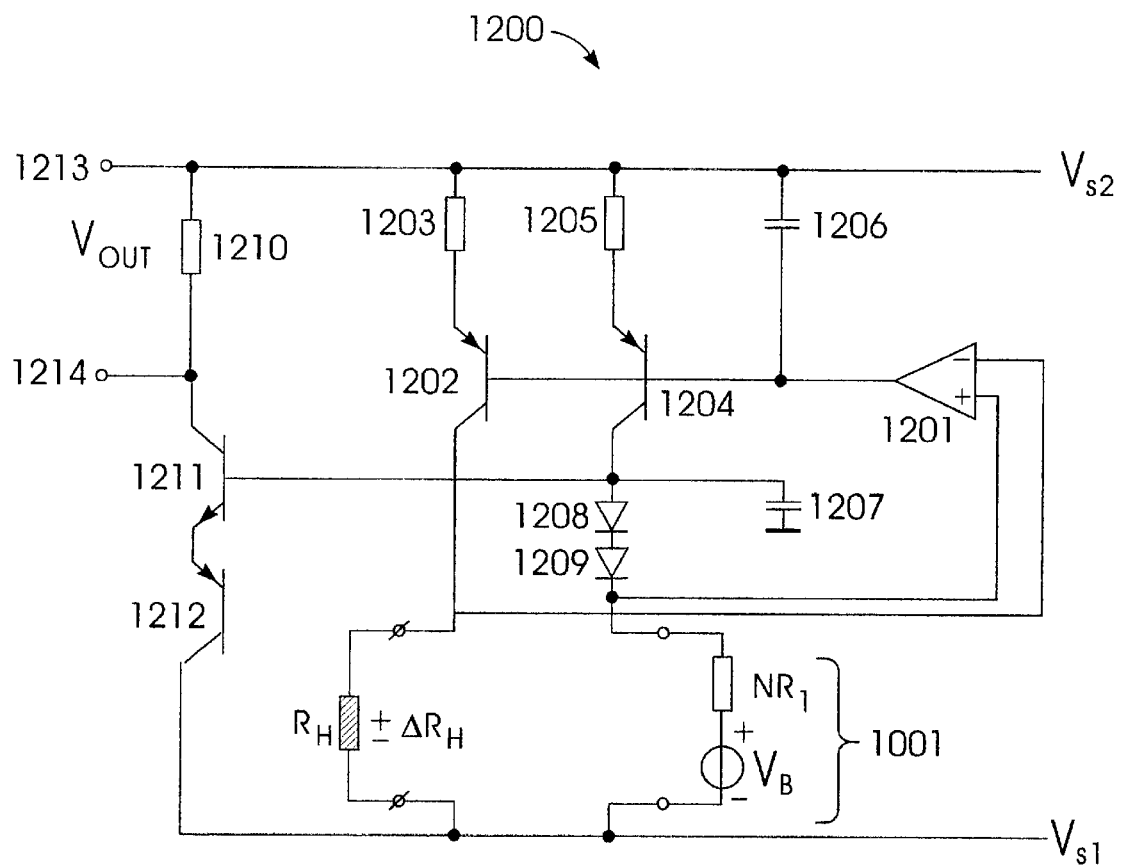
FIG. 12 shows a schematic block diagram of another circuit providing a constant voltage across the sensor resistance portion of an MR head according to the present invention.

FIG. 12 shows a schematic block diagram of another circuit 1200 providing a constant voltage $V_B$ across the sensor resistance $R_S$ portion of an MR head. Circuit 1200 is configured for detecting an MR head readback signal directly from the MR head signal voltage. Circuit 1200 includes MR equivalent circuit 1001. Amplifier 1201 is connected to detect a voltage difference between the voltage $V_H$ appearing across the MR head and the voltage appearing across equivalent circuit 1001. In that regard, the noninverting input of amplifier 1201 is coupled to the MR head, while the inverting input of amplifier 1201 is coupled to the equivalent circuit 1001. The output of amplifier 1201 is connected to the bases of transistors 1202 and 1204, which are both configured as controllable current sources. The area ratio of transistor 1202 to transistor 1204 is preferably N:1 for power savings considerations, but may also be chosen for other considerations. Capacitor 1206 is coupled between the output of amplifier 1201 and a power supply voltage $V_{S2}$ for providing filtering of the control signal output from amplifier 1201.

The emitter of transistor 1202 is coupled to power supply voltage $V_{S2}$ through resistor 1203. Similarly, the emitter of transistor 1204 is coupled to supply voltage $V_{S2}$ through resistor 1205. The collector of transistor 1202 is coupled to the MR head, while the collector of transistor 1204 is coupled to equivalent circuit 1001 through diodes 1208 and 1209. Capacitor 1207 is connected to the collector of transistor 1204 for filtering purposes.

Circuit 1200 includes an output stage formed by transistors 1211 and 1212. The base of transistor 1212 is coupled to the collector of transistor 1202. Similarly, the base of transistor 1211 is coupled to the collector of transistor 1204. The collector of transistor 1211 is coupled to power supply $V_{S2}$ through resistor 1210. The detected readback signal from the MR head is generated across resistor 1210 between terminals 1213 and 1214.

Figure 13:
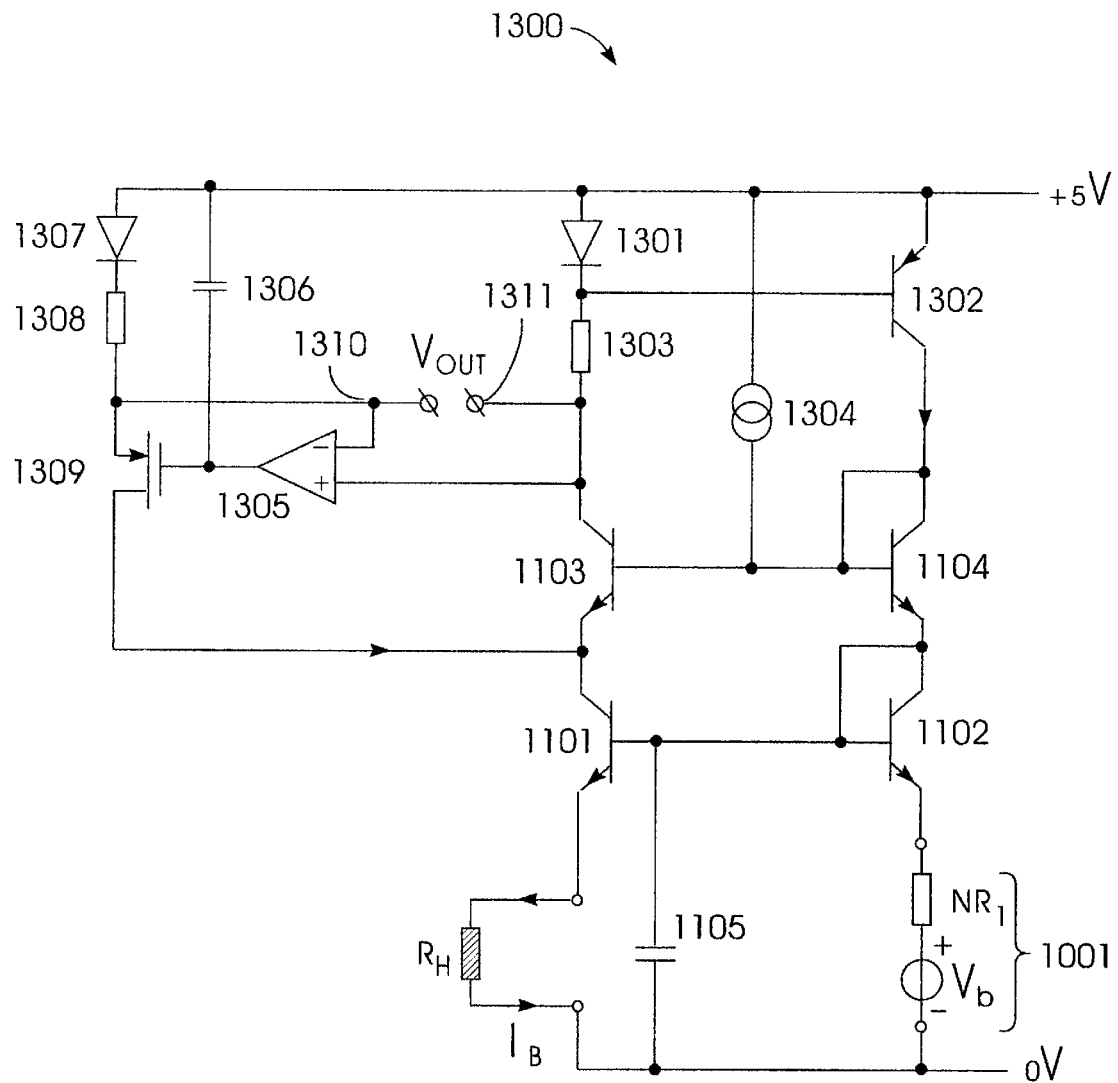
FIG. 13 shows a schematic block diagram of an input stage for a single-ended MR preamplifier circuit using sensor biasing according to the present invention.

FIG. 13 shows a schematic block diagram of an input stage circuit 1300 for a single-ended MR preamplifier using sensor biasing according to the present invention. Circuit 1300 includes circuit 1100 that is shown in FIG. 11. Additionally, a current source 1304 having a current $I_{comp}$ equal to $2I_B/\beta$, where $\beta$ is the current gain of transistor 1103, is connected between a voltage source $V_{S2}$ (+5 V for example) and the bases of transistors 1103 and 1104. The MR head signal $V_{OUT}$ is available between terminals 1310 and 1311, and is described by the following equation:

$$V_{OUT} = \frac{\Delta R_h}{R_h} V_B \frac{R_C}{(r_{e1} + r_{e2})}. \tag{22}$$

A current source containing an amplifier 1305, a capacitor 1306, a compensation diode 1307, a resistor 1308 and a transistor 1309 is used for "bleeding off" part of the bias current $I_B$ around resistor 1303, so that resistor 1303 can have a larger resistive value, for example, 450 Ohms, for providing more gain without causing transistor head-room problems. For a resistive value of 450 Ohms for resistor 1303, resistor 1308 should preferably have a resistive value of 194 Ohms so that 70% of $I_B$ is sourced through transistor 1309. Preferably, capacitor 1306 is 470 pF. To mirror the current through resistor 1303, which is, for example, 30% of the bias current $I_B$, a series diode 1301 (self-biased transistor) is used with transistor 1302. This circuit configuration, however, can result in signal distortion, offset, etc., despite compensation diode 1307 in the bleed-off current source.

Figure 14:
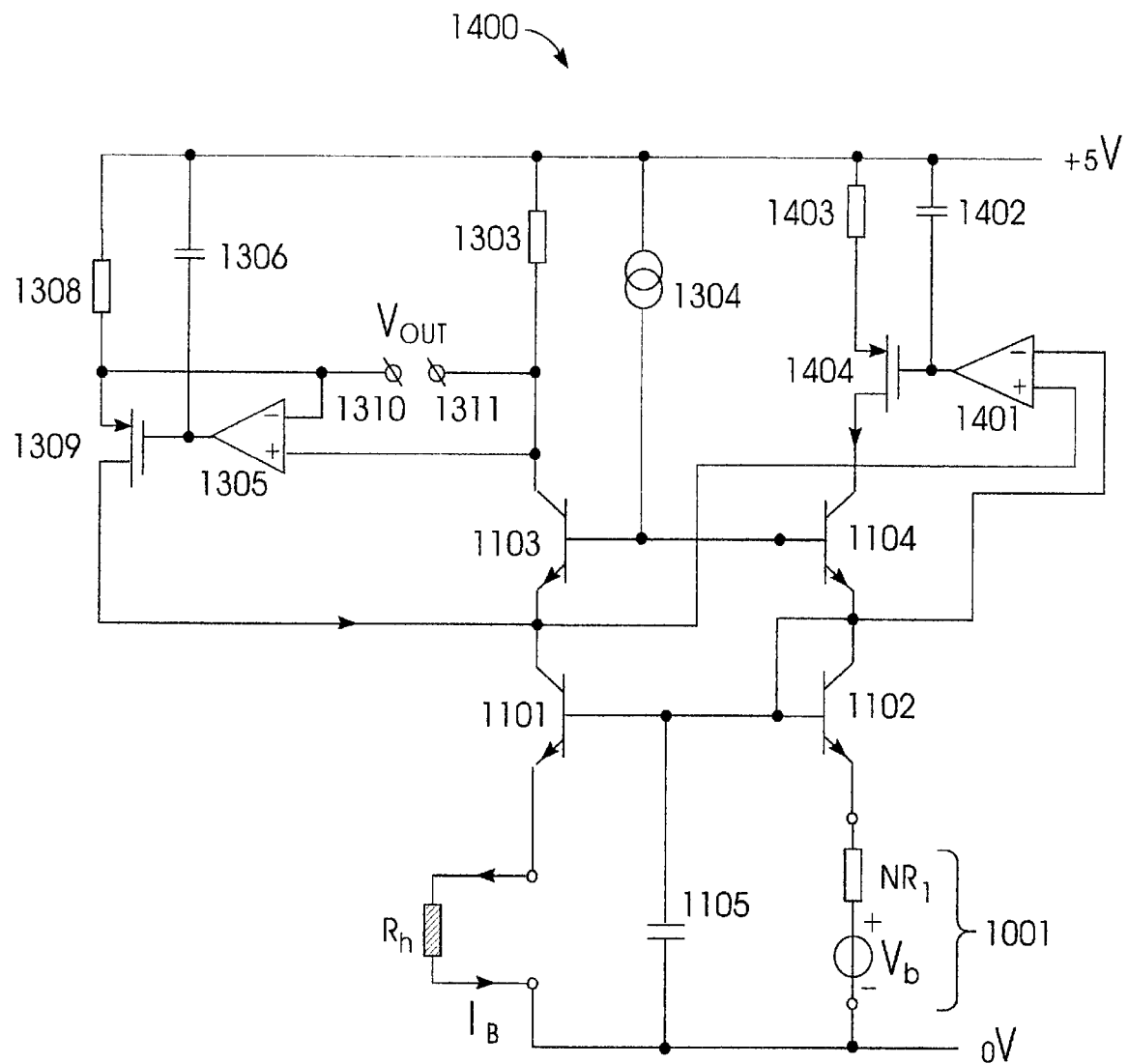
FIG. 14 shows another schematic block diagram of an input stage of a single-ended MR preamplifier circuit using sensor biasing according to the present invention.

The problems of circuit 1300 associated with signal distortion are avoided by circuit 1400, shown in FIG. 14. Circuit 1400 is an input stage of a single-ended MR preamplifier using sensor biasing, and includes circuit 1100 (FIG. 11), and the bleed-off current source (circuit 1300). For circuit 1400, though, diodes 1301 and 1307 of circuit 1300 have been eliminated. Resistors 1303 and 1308 are chosen to be equal, for example, 450 Ohms, so that 50% of $I_B$ flows through transistor 1103 and 50% flows through transistor 1309. An amplifier 1401 is coupled to the emitters of the current mirror formed by transistors 1103 and 1104. The output of amplifier 1401 is coupled to the gate of a transistor 1404. The source of transistor 1404 is coupled to voltage source $V_{S2}$ through resistor 1403. The drain of transistor 1404 is coupled to the collector of transistor 1104. Capacitor 1402 is used for filtering purposes.

In circuit 1400, the magnitude of the compensation current in the right-most vertical branch containing head equivalent circuit 1001 is derived from the base-emitter of the cascode transistor 1103 above input transistor 1101. Amplifier 1401 controls the FET current source, that is, transistor 1404, so that the compensation current in the right-most branch is 1/10 times, for example, the input bias current $I_B$ through the MR head.

In the constant effective magnetic bias scheme of the present invention, an MR sensor having a relatively lower sensor height is biased at a higher current density than would be provided by the second, third or fourth biasing schemes of the present invention. The ideal curve for increasing current density is difficult to realize (FIG. 7(a)), therefore the approximation of FIG. 7(b) is provided by the present invention. The approximation realizes constant voltage bias for low resistance heads (FIG. 7(b)) and constant current bias for higher resistance heads (FIG. 7(c)). The cross-over point between constant $V_B$ and constant $I_B$ is between the minimum head resistance $R_{H\ min}$ and the maximum head resistance $R_{H\ max}$ as encountered in a product, and corresponds to a given sensor height $h_0$.

Figure 15:
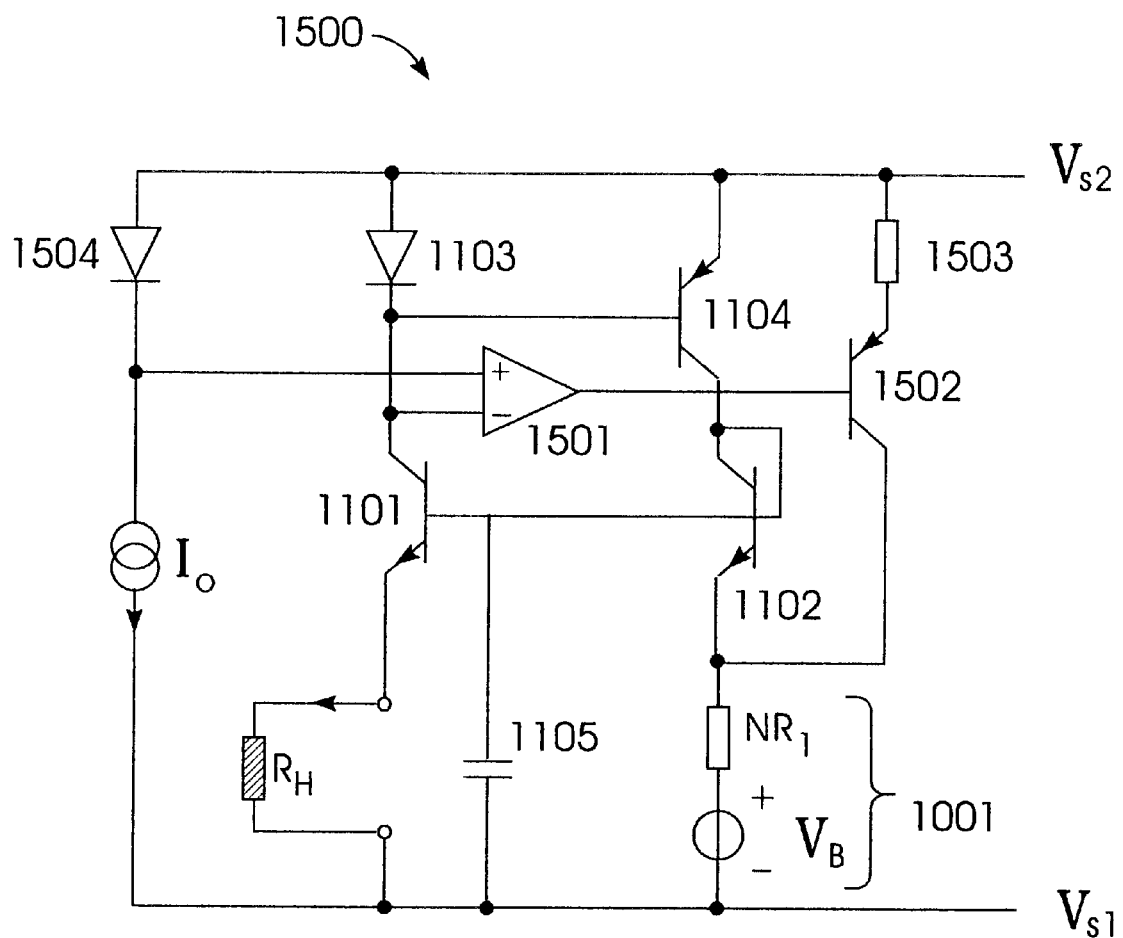
FIG. 15 shows a schematic block diagram of a circuit providing a constant effective magnetic bias for an MR head according to the present invention.
Figure 16A:
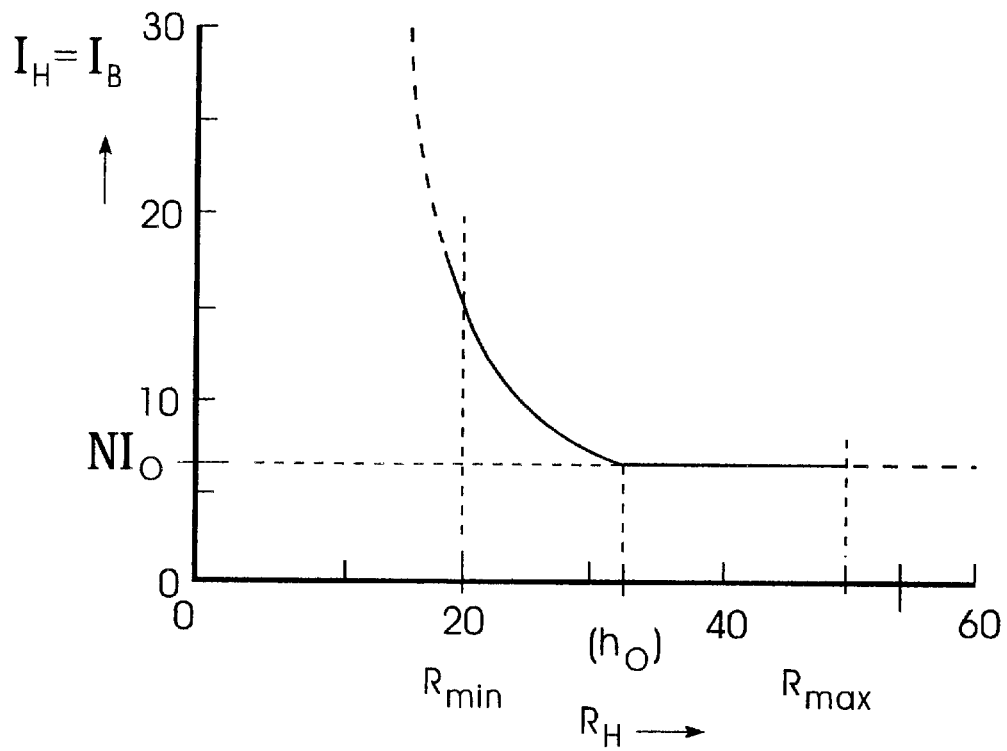
FIGS. 16(a) and 16(b) show head biasing conditions for a constant effective magnetic biasing according to the present invention.
Figure 16B:
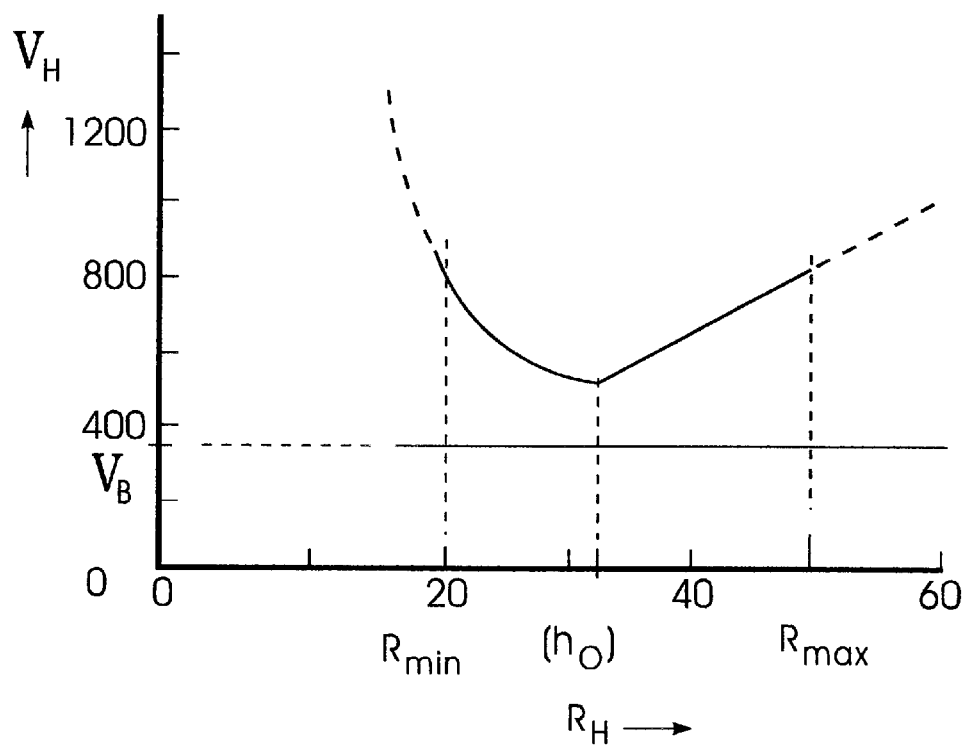

FIG. 15 shows a schematic block diagram of a circuit 1500 providing a constant effective magnetic bias according to the present invention. Circuit 1500 includes circuit 1100 of FIG. 11. Circuit 1500 provides a constant sensor voltage for relatively low values of $R_H$ for which the head bias current through $R_H$ and transistor 1101 is sufficiently large to turn off a controllable current source formed by transistor 1502 and resistor 1503. For a relatively higher value of head resistance $R_H$, the bias current $I_B$ becomes sufficiently small that amplifier 1501, which compares the voltage drop across transistor 1504 with the voltage drop across transistor 1103 (both shown connected as diodes), applies a forward voltage to the base of transistor 1502. Transistor turns on accordingly and circuit 1500 supplies a constant current bias to the MR head. FIGS. 16(a) and 16(b) show exemplary MR head biasing conditions for constant effective magnetic biasing circuit 1500. The cross-over point is determined by the value of the (reference) current $I_0$ and the transistor area ratio N. So, for head resistance $R_H$ sufficiently large that $$I_B > V_B/(R_H - R_l), \quad (23)$$

the head bias current $I_B$ is kept constant at the value, $I_B = NI_0$.

For lower values of head resistance $R_H$, the bias current $I_B$ is determined by $$I_B = V_B/(R_H - R_l). \quad (24)$$

The cross-over point occurs at the value of $R_H$ given by $$R_{h0} = \frac{V_B}{NI_0} + R_l \quad (25)$$

and can be located anywhere within the product head resistance interval $$R_{h\ min} \leq R_{h0} \leq R_{h\ max}. \quad (26)$$

All of the disclosed embodiments and configurations of the bias circuit of the present invention can be made part of circuitry in an MR/AE module which is part of a disk drive.

While the present invention has been described in connection with the illustrated embodiments, it will be appreciated and understood that modifications may be made without departing from the true spirit and scope of the invention.

What is claimed is:

1. A biasing circuit for a magnetoresistive (MR) transducer having a total resistance $R_H$, the total MR transducer resistance $R_H$ including a sensor resistance $R_S$, a lead resistance $R_l$ and a front-lead resistance $R_f$, the biasing circuit comprising:
   a transducer equivalent circuit including a voltage source and an input resistance, the voltage source having a predetermined voltage and the input resistance having a resistance that is related to the lead resistance $R_l$ of the MR transducer;
   a difference sensing circuit having first and second inputs, the first input being coupled to the MR transducer and the second input being coupled to the transducer equivalent circuit, the difference sensing circuit sensing a voltage difference between the first and second inputs;
   a first current source responsive to the difference sensing circuit by generating a bias current $I_B$ for the MR transducer, the first current source being the sole source of the bias current $I_B$ for the MR transducer; and
   a second current source responsive to the difference sensing circuit by generating a control current that is coupled to the transducer equivalent circuit, the control current being proportional to the MR transducer bias current $I_B$ so that the predetermined voltage of the voltage source equals a predetermined voltage $V_B$ appearing across the sensor resistance $R_S$.

2. The biasing circuit according to claim 1, wherein the biasing circuit is part of an MR head/arm electronics (AE) circuit.

3. The biasing circuit according to claim 2, wherein the MR head/AE circuit is part of a disk drive.

4. The biasing circuit according to claim 1, wherein the difference sensing circuit includes first and second transistors each having first, second and third nodes, the first node of first transistor being coupled to the first and third nodes of the second transistor, the second node of the first transistor being coupled to the MR transducer, and the second node of the second transistor being coupled to the transducer equivalent circuit, and
   wherein the first current source includes a third transistor having first, second and third nodes, and the second current source includes a fourth transistor having first, second and third nodes, the first and third nodes of the third transistor being coupled to the first node of the fourth transistor to form a current mirror, the third node of the third transistor being coupled to the third node of the first transistor, and the third node of the fourth transistor being coupled to the third node of the second transistor.

5. The biasing circuit according to claim 4, wherein an area ratio of the first transistor to the second transistor is N:1, and an area ratio of the third transistor to the fourth transistor is N:1.

6. The biasing circuit according to claim 1, wherein the difference sensing circuit further including an output,
   wherein the first current source includes a first transistor having first, second and third nodes, and the second current source includes a second transistor having first, second and third nodes,
   the first node of the first transistor and the first node of the second transistor each being coupled to the output of the difference sensing circuit, the third node of the first transistor being coupled to the MR transducer, and the third node of the second transistor being coupled to the MR transducer equivalent circuit,
   the biasing circuit further comprising:
   an output circuit having first and second input nodes and an output node, the first input node of the output circuit being coupled to the third node of the first transistor, the second input node of the output circuit being coupled to the third node of the second transistor.

7. The biasing circuit according to claim 1, wherein the difference sensing circuit includes first and second transistors each having first, second and third nodes, the first node of first transistor being coupled to the first and third nodes of the second transistor, the second node of the first transistor being coupled to the MR transducer, and the second node of the second transistor being coupled to the transducer equivalent circuit,
   wherein the first current source includes third and fourth transistors each having first, second and third nodes, the second node of each of the third and fourth transistors being coupled to the third node of the first transistor, and wherein the second current source includes a fifth transistor having first, second and third nodes, the first node of the third transistor being coupled to the first and third node of the fifth transistor to form a current mirror, and the second node of the fifth transistor being coupled to the third node of the second transistor.

8. The biasing circuit according to claim 7, wherein an area ratio of the first transistor to the second transistor is N:1, and a current ratio of current flowing in the second node of the fourth transistor to the current flowing in the second node of the third transistor to the current flowing in the second node of the fifth transistor K:L:1, where K+L equals N.

9. The biasing circuit according to claim 1, further comprising:

a current sensing circuit sensing the bias current $I_B$ generated by the first current source for the predetermined bias voltage $V_S$ appearing across the sensor resistance $R_S$; and a third current source responsive to the current sensing circuit by generating an output current when the bias current $I_B$ generated by the first current source for the predetermined bias voltage $V_S$ is less than a predetermined sensor bias current, the output current generated by the third current source being coupled to the transducer equivalent circuit and combining with the control current generated by the second current source to form a combined control current, the combined control current being related to the MR transducer bias current $I_B$ so that a predetermined MR transducer bias current $I_B$ flows through the sensor resistance $R_S$ producing a predetermined effective magnetic bias of the sensor resistance $R_S$.

10. The biasing circuit according to claim 9, wherein the difference sensing circuit includes first and second transistors each having first, second and third nodes, the first node of first transistor being coupled to the first and third nodes of the second transistor, the second node of the first transistor being coupled to the MR transducer, and the second node of the second transistor being coupled to the transducer equivalent circuit, and wherein the first current source includes a third transistor having first, second and third nodes, and the second current source includes a fourth transistor having first, second and third nodes, the first and third nodes of the third transistor being coupled to the first node of the fourth transistor to form a current mirror, the third node of the third transistor being coupled to the third node of the first transistor, and the third node of the fourth transistor being coupled to the third node of the second transistor.

11. The biasing circuit according to claim 10, wherein the current sensing circuit includes, a fifth transistor having first, second and third nodes, the first node being coupled to the third node;

a fourth current source coupled to the third node of the fifth transistor; and an amplifier circuit having a first input, a second input and an output, the first input being coupled to the third node of the third transistor, the second input being coupled to the third node of the fifth transistor and the output being coupled to the third current source.

12. A circuit for magnetically biasing a magnetoresistive (MR) transducer, the MR transducer including a sensor portion having a sensor resistance $R_S$, a lead portion having a lead resistance $R_l$ and a front-lead portion having a front-lead resistance $R_f$, the biasing circuit comprising:

a transducer equivalent circuit;

a difference sensing circuit having first and second inputs, the first input being coupled to the MR transducer and the second input being coupled to the transducer equivalent circuit, the difference sensing circuit sensing a voltage difference between the first and second inputs;

a first current source responsive to the difference sensing circuit by generating a bias current $I_B$ for the MR transducer, the first current source being the sole source of the bias current $I_B$ for the MR transducer; and a second current source responsive to the difference sensing circuit by generating a control current that is coupled to the transducer equivalent circuit, the control current being proportional to the MR transducer bias current $I_B$ so that the bias current $I_B$ through the MR transducer produces a predetermined effective magnetic bias of the sensor portion of the MR transducer.

13. The circuit according to claim 12, wherein the circuit is part of an MR head/arm electronics (AE) circuit.

14. The circuit according to claim 13, wherein the MR head/AE circuit is part of a disk drive.

15. The circuit according to claim 12, further comprising:

a current sensing circuit sensing the bias current $I_B$ generated by the first current source for the predetermined effective magnetic bias of the sensor portion of the MR transducer; and a third current source responsive to the current sensing circuit by generating an output current when the bias current $I_B$ generated by the first current source for the predetermined effective magnetic bias of the sensor portion of the MR transducer is less than a predetermined sensor bias current, the output current generated by the third current source being coupled to the transducer equivalent circuit and combining with the control current generated by the second current source to form a combined control current, the combined control current being related to the MR transducer bias current $I_B$ so that a predetermined MR transducer bias current $I_B$ flows through the MR transducer producing the predetermined effective magnetic bias of the sensor portion of the MR transducer.

16. The circuit according to claim 15, wherein the difference sensing circuit includes first and second transistors each having first, second and third nodes, the first node of first transistor being coupled to the first and third nodes of the second transistor, the second node of the first transistor being coupled to the MR transducer, and the second node of the second transistor being coupled to the transducer equivalent circuit, and wherein the first current source includes a third transistor having first, second and third nodes, and the second current source includes a fourth transistor having first, second and third nodes, the first and third nodes of the third transistor being coupled to the first node of the fourth transistor to form a current mirror, the third node of the third transistor being coupled to the third node of the first transistor, and the third node of the fourth transistor being coupled to the third node of the second transistor.

17. The circuit according to claim 16, wherein the current sensing circuit includes, a fifth transistor having first, second and third nodes, the first node being coupled to the third node;

a fourth current source coupled to the third node of the fifth transistor; and an amplifier circuit having a first input, a second input and an output, the first input being coupled to the third node of the third transistor, the second input being coupled to the third node of the fifth transistor and the output being coupled to the third current source.

18. A magnetoresistive (MR) head/arm electronics (AE) circuit comprising:

a magnetoresistive transducer, the magnetoresistive transducer having a total resistance $R_H$, the total MR transducer resistance $R_H$ including a sensor resistance $R_S$, a lead resistance $R_l$ and a front-lead resistance $R_f$;

a transducer equivalent circuit including a voltage source and an input resistance, the voltage source having a predetermined voltage and the input resistance having a resistance that is related to the lead resistance $R_l$ of the MR transducer;

a difference sensing circuit having first and second inputs, the first input being coupled to the MR transducer and the second input being coupled to the transducer equivalent circuit, the difference sensing circuit sensing a voltage difference between the first and second inputs;

a first current source responsive to the difference sensing circuit by generating a bias current $I_B$ for the MR transducer; and a second current source responsive to the difference sensing circuit by generating a control current that is coupled to the transducer equivalent circuit, the control current being proportional to the MR transducer bias current $I_B$ so that the predetermined voltage of the voltage source equals a predetermined voltage $V_B$ appearing across the sensor resistance $R_S$.

19. The circuit according to claim 18, wherein the MR head/AE circuit is part of a disk drive.

20. The circuit according to claim 18, wherein the difference sensing circuit includes first and second transistors each having first, second and third nodes, the first node of first transistor being coupled to the first and third nodes of the second transistor, the second node of the first transistor being coupled to the MR transducer, and the second node of the second transistor being coupled to the transducer equivalent circuit, and wherein the first current source includes a third transistor having first, second and third nodes, and the second current source includes a fourth transistor having first, second and third nodes, the first and third nodes of the third transistor being coupled to the first node of the fourth transistor to form a current mirror, the third node of the third transistor being coupled to the third node of the first transistor, and the third node of the fourth transistor being coupled to the third node of the second transistor.

21. The circuit according to claim 20, wherein an area ratio of the first transistor to the second transistor is N:1, and an area ratio of the third transistor to the fourth transistor is N:1.

22. The circuit according to claim 18, wherein the difference sensing circuit further including an output, wherein the first current source includes a first transistor having first, second and third nodes, and the second current source includes a second transistor having first, second and third nodes, the first node of the first transistor and the first node of the second transistor each being coupled to the output of the difference sensing circuit, the third node of the first transistor being coupled to the MR transducer, and the third node of the second transistor being coupled to the MR transducer equivalent circuit, the malae circuit further comprising:

an output circuit having first and second input nodes and an output node, the first input node of the output circuit being coupled to the third node of the first transistor, the second input node of the output circuit being coupled to the third node of the second transistor.

23. The circuit according to claim 18, wherein the difference sensing circuit includes first and second transistors each having first, second and third nodes, the first node of first transistor being coupled to the first and third nodes of the second transistor, the second node of the first transistor being coupled to the MR transducer, and the second node of the second transistor being coupled to the transducer equivalent circuit, wherein the first current source includes third and fourth transistors each having first, second and third nodes, the second node of each of the third and fourth transistors being coupled to the third node of the first transistor, and wherein the second current source includes a fifth transistor having first, second and third nodes, the first node of the third transistor being coupled to the first and third node of the fifth transistor to form a current mirror, and the second node of the fifth transistor being coupled to the third node of the second transistor.

24. The circuit according to claim 23, wherein an area ratio of the first transistor to the second transistor is N:1, and a current ratio of current flowing in the second node of the fourth transistor to the current flowing in the second node of the third transistor to the current flowing in the second node of the fifth transistor K:L:1, where K+L equals N.

25. The circuit according to claim 18, further comprising:

a current sensing circuit sensing the bias current $I_B$ generated by the first current source for the predetermined bias voltage $V_S$ appearing across the sensor resistance $R_S$; and a third current source responsive to the current sensing circuit by generating an output current when the bias current $I_B$ generated by the first current source for the predetermined bias voltage $V_S$ is less than a predetermined sensor bias current, the output current generated by the third current source being coupled to the transducer equivalent circuit and combining with the control current generated by the second current source to form a combined control current, the combined control current being related to the MR transducer bias current $I_B$ so that a predetermined MR transducer bias current $I_B$ flows through the sensor resistance $R_S$ producing a predetermined effective magnetic bias of the sensor resistance $R_S$.

26. The circuit according to claim 25, wherein the difference sensing circuit includes first and second transistors each having first, second and third nodes, the first node of first transistor being coupled to the first and third nodes of the second transistor, the second node of the first transistor being coupled to the MR transducer, and the second node of the second transistor being coupled to the transducer equivalent circuit, and wherein the first current source includes a third transistor having first, second and third nodes, and the second current source includes a fourth transistor having first, second and third nodes, the first and third nodes of the third transistor being coupled to the first node of the fourth transistor to form a current mirror, the third node of the third transistor being coupled to the third node of the first transistor, and the third node of the fourth transistor being coupled to the third node of the second transistor.

27. The circuit according to claim 26, wherein the current sensing circuit includes, a fifth transistor having first, second and third nodes, the first node being coupled to the third node;

a fourth current source coupled to the third node of the fifth transistor; and an amplifier circuit having a first input, a second input and an output, the first input being coupled to the third node of the third transistor, the second input being coupled to the third node of the fifth transistor and the output being coupled to the third current source.

28. A magnetoresistive (MR) head/arm electronics (AE) circuit comprising:

a magnetoresistive transducer, the magnetoresistive transducer having a total resistance $R_H$, the total MR transducer resistance $R_H$ including a sensor resistance $R_s$, a lead resistance $R_l$ and a front-lead resistance $R_f$;

a transducer equivalent circuit;

a difference sensing circuit having first and second inputs, the first input being coupled to the MR transducer and the second input being coupled to the transducer equivalent circuit, the difference sensing circuit sensing a voltage difference between the first and second inputs;

a first current source responsive to the difference sensing circuit by generating a bias current $I_B$ for the MR transducer, the first current source being the sole source of the bias current $I_B$ for the MR transducer; and a second current source responsive to the difference sensing circuit by generating a control current that is coupled to the transducer equivalent circuit, the control current being proportional to the MR transducer bias current $I_B$ so that the bias current $I_B$ through the MR transducer produces a predetermined effective magnetic bias of the sensor portion of the MR transducer.

29. The circuit according to claim 28, wherein the MR head/AE circuit is part of a disk drive.

30. The circuit according to claim 28, further comprising:

a current sensing circuit sensing the bias current $I_B$ generated by the first current source for the predetermined effective magnetic bias of the sensor portion of the MR transducer; and a third current source responsive to the current sensing circuit by generating an output current when the bias current $I_B$ generated by the first current source for the predetermined effective magnetic bias of the sensor portion of the MR transducer is less than a predetermined sensor bias current, the output current generated by the third current source being coupled to the transducer equivalent circuit and combining with the control current generated by the second current source to form a combined control current, the combined control current being related to the MR transducer bias current $I_B$ so that a predetermined MR transducer bias current $I_B$ flows through the MR transducer producing the predetermined effective magnetic bias of the sensor portion of the MR transducer.

31. The circuit according to claim 30, wherein the difference sensing circuit includes first and second transistors each having first, second and third nodes, the first node of first transistor being coupled to the first and third nodes of the second transistor, the second node of the first transistor being coupled to the MR transducer, and the second node of the second transistor being coupled to the transducer equivalent circuit, and wherein the first current source includes a third transistor having first, second and third nodes, and the second current source includes a fourth transistor having first, second and third nodes, the first and third nodes of the third transistor being coupled to the first node of the fourth transistor to form a current mirror, the third node of the third transistor being coupled to the third node of the first transistor, and the third node of the fourth transistor being coupled to the third node of the second transistor.

32. The circuit according to claim 31, wherein the current sensing circuit includes, a fifth transistor having first, second and third nodes, the first node being coupled to the third node;

a fourth current source coupled to the third node of the fifth transistor; and an amplifier circuit having a first input, a second input and an output, the first input being coupled to the third node of the third transistor, the second input being coupled to the third node of the fifth transistor and the output being coupled to the third current source.

* * * * *